(12) United States Patent
Ochi et al.

(10) Patent No.: US 10,915,266 B2
(45) Date of Patent: Feb. 9, 2021

(54) STORAGE DEVICE

(71) Applicants: TOSHIBA MEMORY CORPORATION, Tokyo (JP); TOSHIBA INFORMATION SYSTEMS (JAPAN) CORPORATION, Kawasaki (JP)

(72) Inventors: Yusuke Ochi, Yokohama Kanagawa (JP); Masanobu Shirakawa, Chigasaki Kanagawa (JP); Yoshihisa Kojima, Kawasaki Kanagawa (JP); Kiyotaka Iwasaki, Yokohama Kanagawa (JP); Katsuhiko Ueki, Tokyo (JP); Kouji Watanabe, Tokyo (JP)

(73) Assignees: TOSHIBA MEMORY CORPORATION, Tokyo (JP); TOSHIBA INFORMATION SYSTEMS (JAPAN) CORPORATION, Kanagawa (JP)

( * ) Notice: Subject to any disclaimer, the term of this patent is extended or adjusted under 35 U.S.C. 154(b) by 53 days.

(21) Appl. No.: 15/268,502

(22) Filed: Sep. 16, 2016

(65) Prior Publication Data
US 2017/0262229 A1    Sep. 14, 2017

(30) Foreign Application Priority Data
Mar. 14, 2016    (JP) .................................. 2016-050252

(51) Int. Cl.
| | | |
|---|---|---|
| G06F 3/06 | (2006.01) | |
| G06F 12/00 | (2006.01) | |
| G06F 13/00 | (2006.01) | |
| G11C 16/16 | (2006.01) | |
| G11C 16/32 | (2006.01) | |
| G11C 16/34 | (2006.01) | |
| G11C 16/26 | (2006.01) | |
| G11C 16/10 | (2006.01) | |

(52) U.S. Cl.
CPC .......... *G06F 3/0659* (2013.01); *G06F 3/0611* (2013.01); *G06F 3/0679* (2013.01); *G06F 3/0688* (2013.01); *G11C 16/16* (2013.01); *G11C 16/32* (2013.01); *G11C 16/3445* (2013.01); *G11C 16/10* (2013.01); *G11C 16/26* (2013.01)

(58) Field of Classification Search
CPC ..... G06F 3/0619; G06F 3/0659; G06F 3/0613
USPC ......................................................... 711/103
See application file for complete search history.

(56) References Cited

U.S. PATENT DOCUMENTS 5,954,828 A * 9/1999 Lin ........................ G11C 29/88
                                                    365/201
8,645,656 B2 * 2/2014 Yoon ....................... G06F 3/061
                                                    711/167

(Continued)

FOREIGN PATENT DOCUMENTS

JP    2008034045 A    2/2008

*Primary Examiner* — Mohamed M Gebril
(74) *Attorney, Agent, or Firm* — Holtz, Holtz & Volek PC

(57) ABSTRACT

According to one embodiment, a storage device includes a first memory cell; a second memory cell; and a controller configured to, in response to receiving a first command set, execute a first erase operation which is included in an erase operation of data of the first memory cell, and suspend the first erase operation, and in response to receiving a second command set, execute a read operation or a write operation of the second memory cell and subsequently resume the suspended first erase operation.

22 Claims, 31 Drawing Sheets

(56) References Cited

U.S. PATENT DOCUMENTS

| | | | |
|---|---|---|---|
| 9,025,390 B2* | 5/2015 | Nakai | G11C 16/3445 |
| | | | 365/185.29 |
| 9,437,308 B2* | 9/2016 | Nakai | G11C 16/14 |
| 9,754,672 B2* | 9/2017 | Nakai | G11C 16/14 |
| 2004/0066675 A1* | 4/2004 | Imamiya | G11C 29/028 |
| | | | 365/200 |
| 2008/0140880 A1* | 6/2008 | Shinozaki | G11C 16/16 |
| | | | 710/32 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2010/0214838 A1 | 8/2010 | Hishida et al. | |
| 2010/0259994 A1 | 10/2010 | Terauchi | |
| 2011/0182125 A1* | 7/2011 | Itoh | G11C 16/30 |
| | | | 365/185.33 |
| 2011/0185106 A1* | 7/2011 | Yano | G06F 11/1471 |
| | | | 711/103 |
| 2011/0284946 A1 | 11/2011 | Kiyotoshi | |
| 2012/0044764 A1 | 2/2012 | Nakai et al. | |
| 2012/0069663 A1 | 3/2012 | Itagaki et al. | |
| 2012/0254515 A1* | 10/2012 | Melik-Martirosian | G06F 12/0246 |
| | | | 711/103 |
| 2012/0307557 A1 | 12/2012 | Itagaki | |
| 2013/0128675 A1* | 5/2013 | Kim | G11C 7/1063 |
| | | | 365/189.05 |
| 2013/0198451 A1* | 8/2013 | Hyun | G11C 16/225 |
| | | | 711/114 |
| 2014/0010015 A1* | 1/2014 | Nakai | G11C 16/14 |
| | | | 365/185.11 |
| 2014/0047167 A1 | 2/2014 | Kwak | |
| 2014/0215175 A1* | 7/2014 | Kasorla | G06F 13/26 |
| | | | 711/167 |
| 2014/0226410 A1* | 8/2014 | Nakamura | G11C 16/26 |
| | | | 365/185.18 |
| 2015/0221381 A1* | 8/2015 | Nam | G11C 16/3445 |
| | | | 365/185.12 |
| 2016/0035428 A1* | 2/2016 | Jung | G11C 16/32 |
| | | | 365/185.11 |
| 2016/0092116 A1* | 3/2016 | Liu | G11C 29/028 |
| | | | 711/103 |
| 2017/0131929 A1* | 5/2017 | Yano | G11C 7/20 |
| 2017/0262229 A1* | 9/2017 | Ochi | G06F 3/0688 |
| 2017/0285969 A1* | 10/2017 | Madraswala | G11C 16/225 |

* cited by examiner

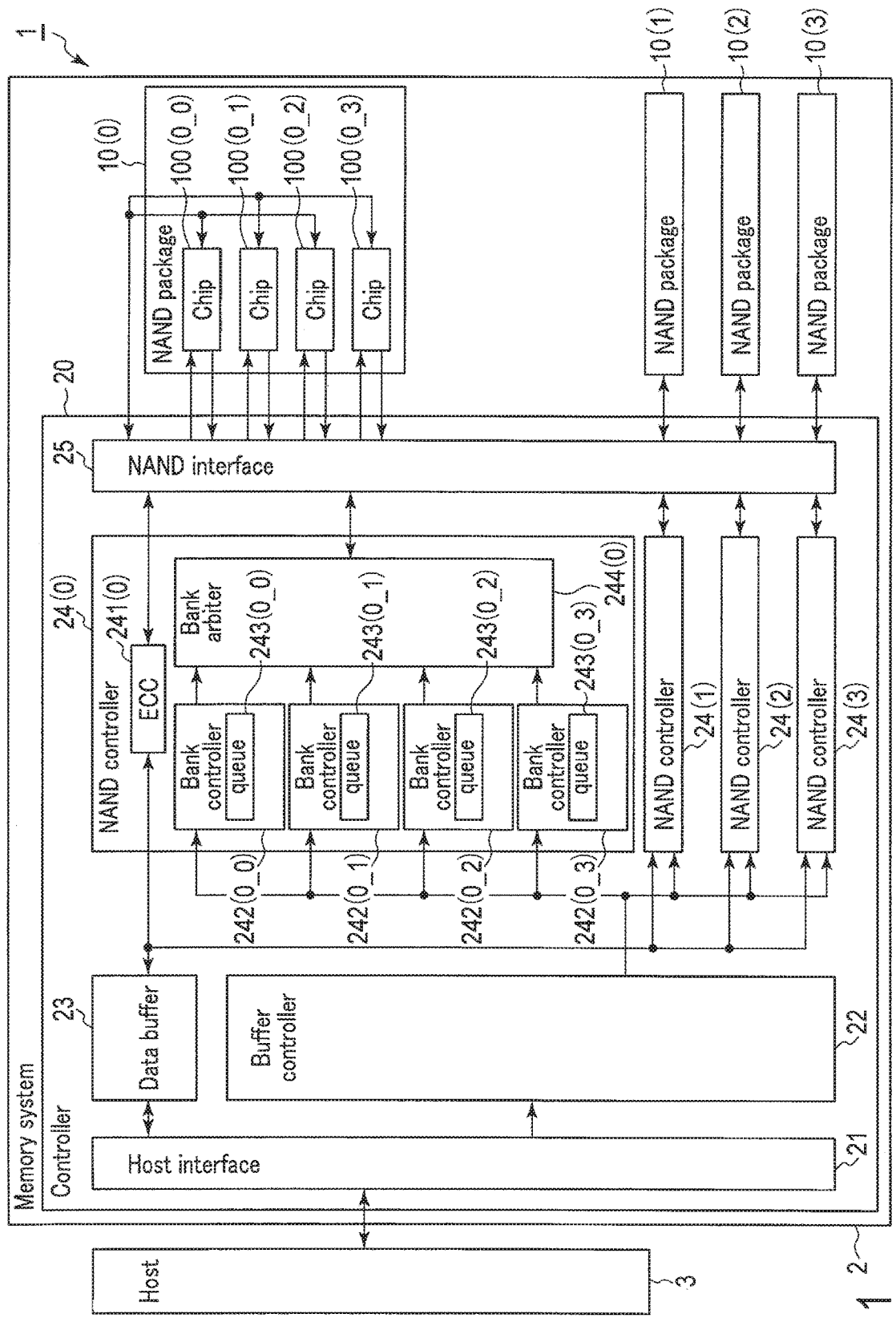
F I G. 1

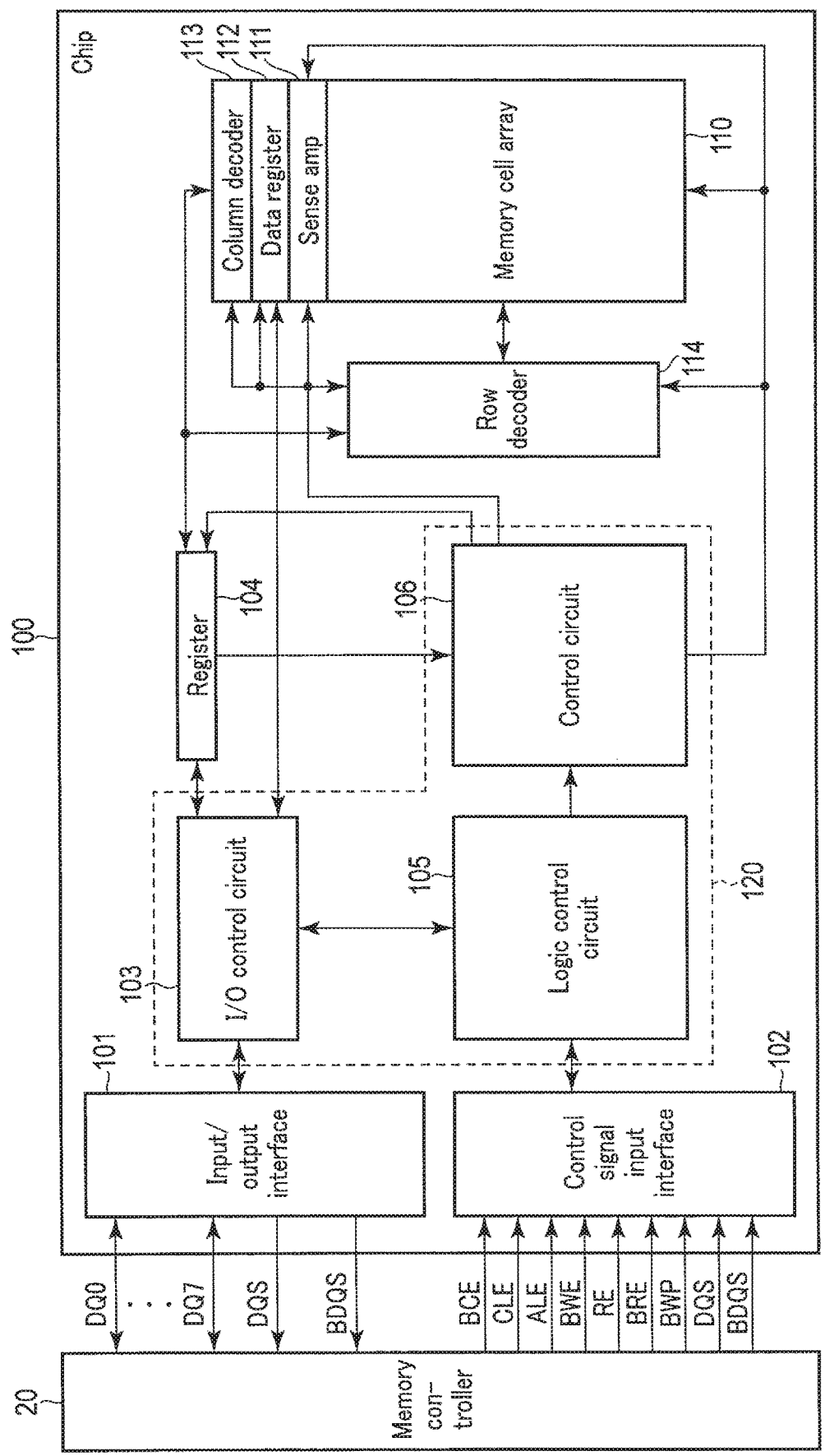
F I G. 2

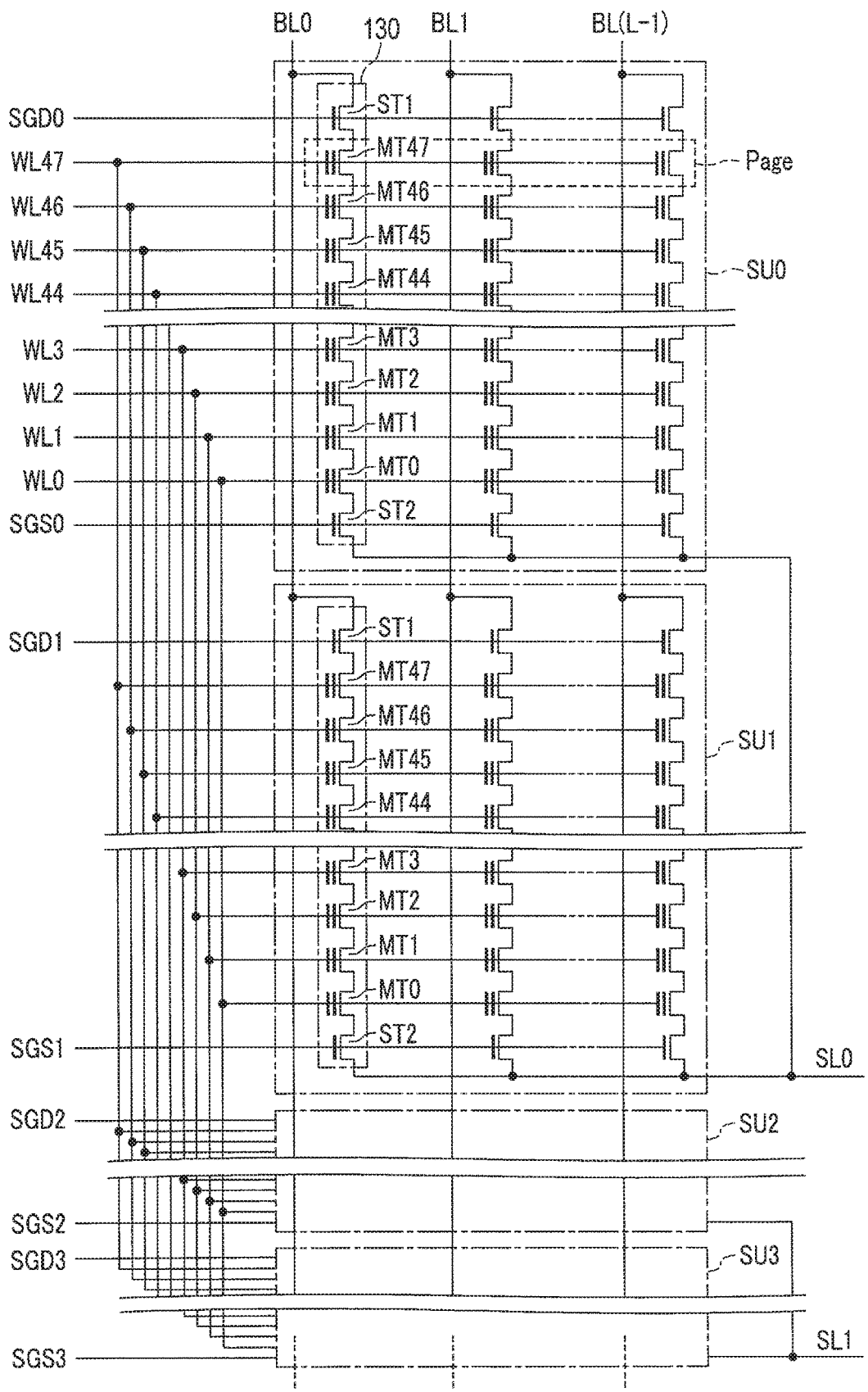
F I G. 4

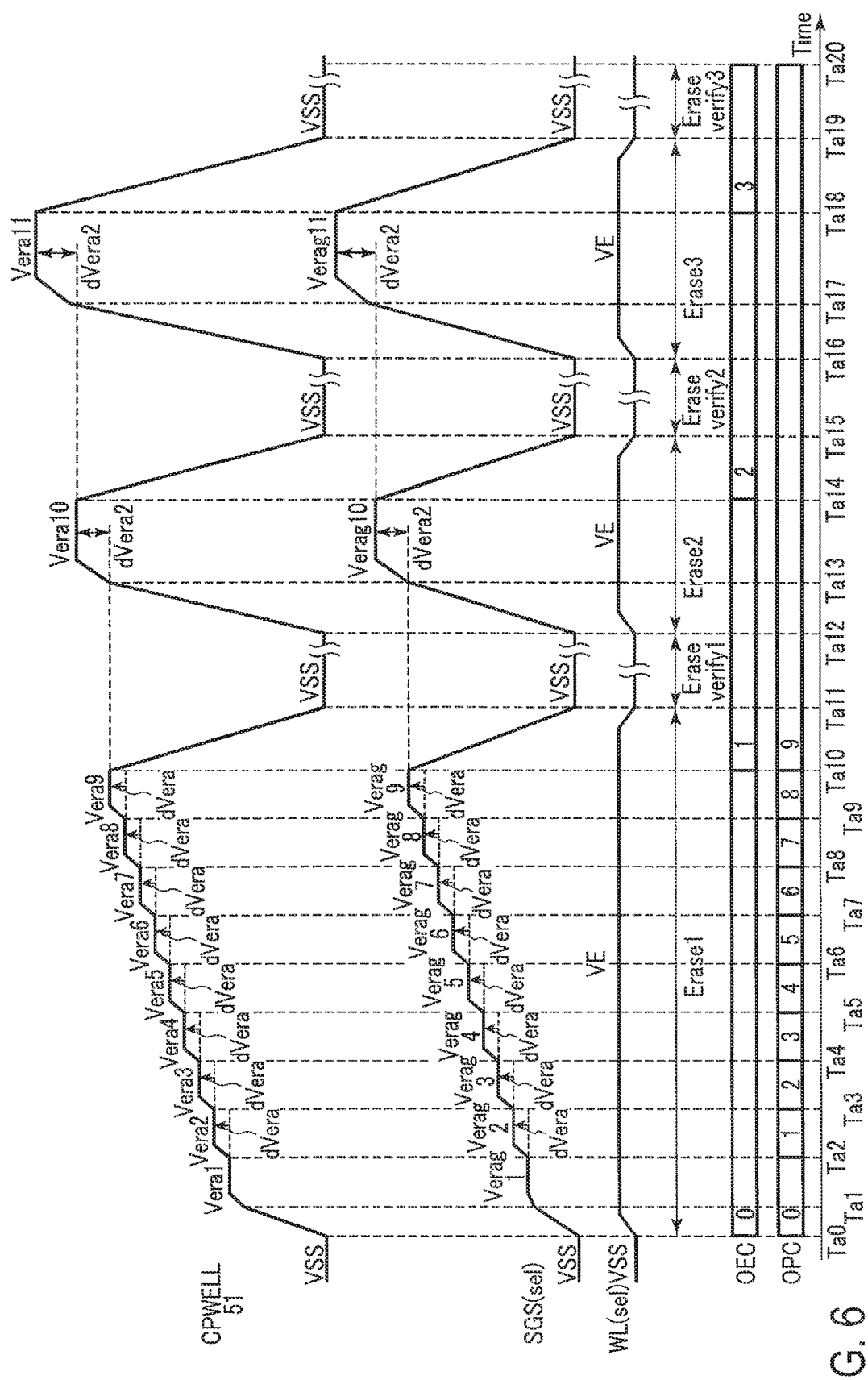
F I G. 6

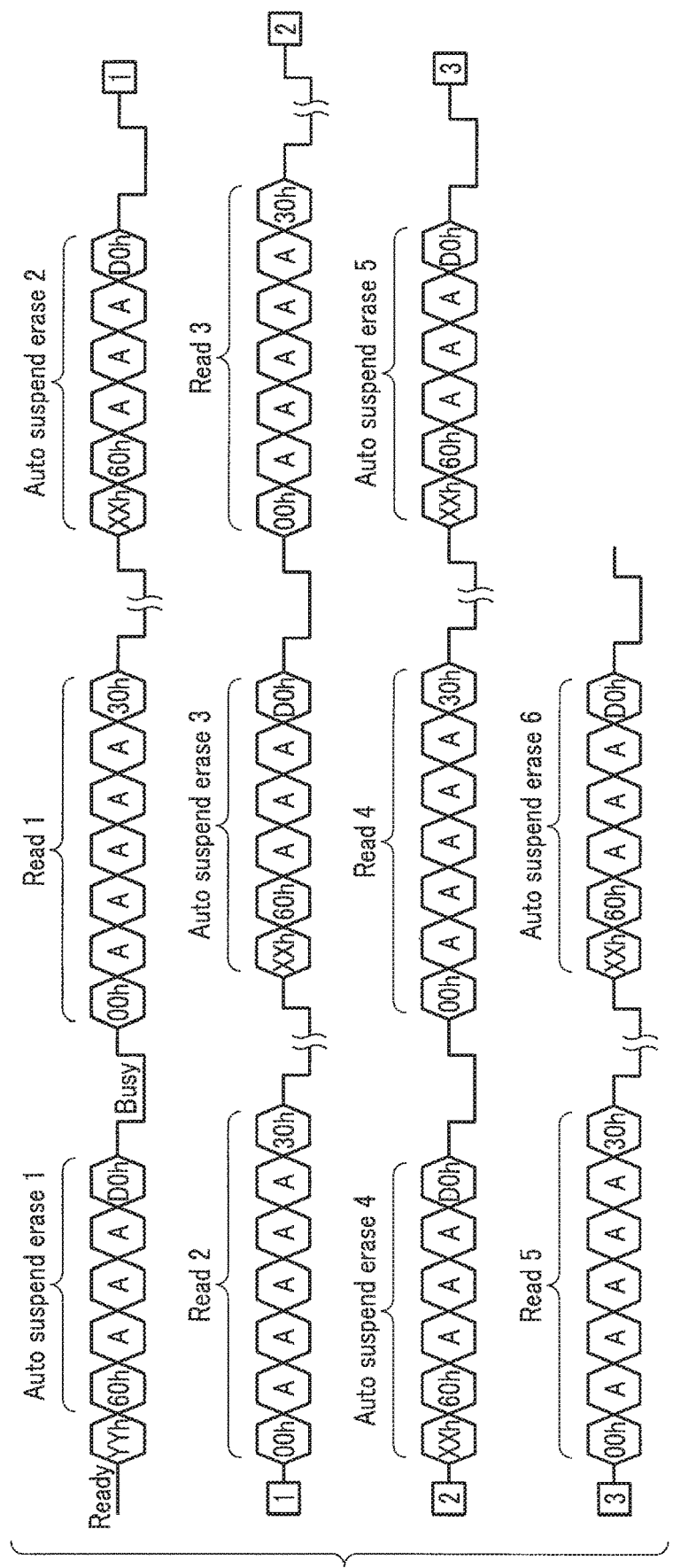
F I G. 8

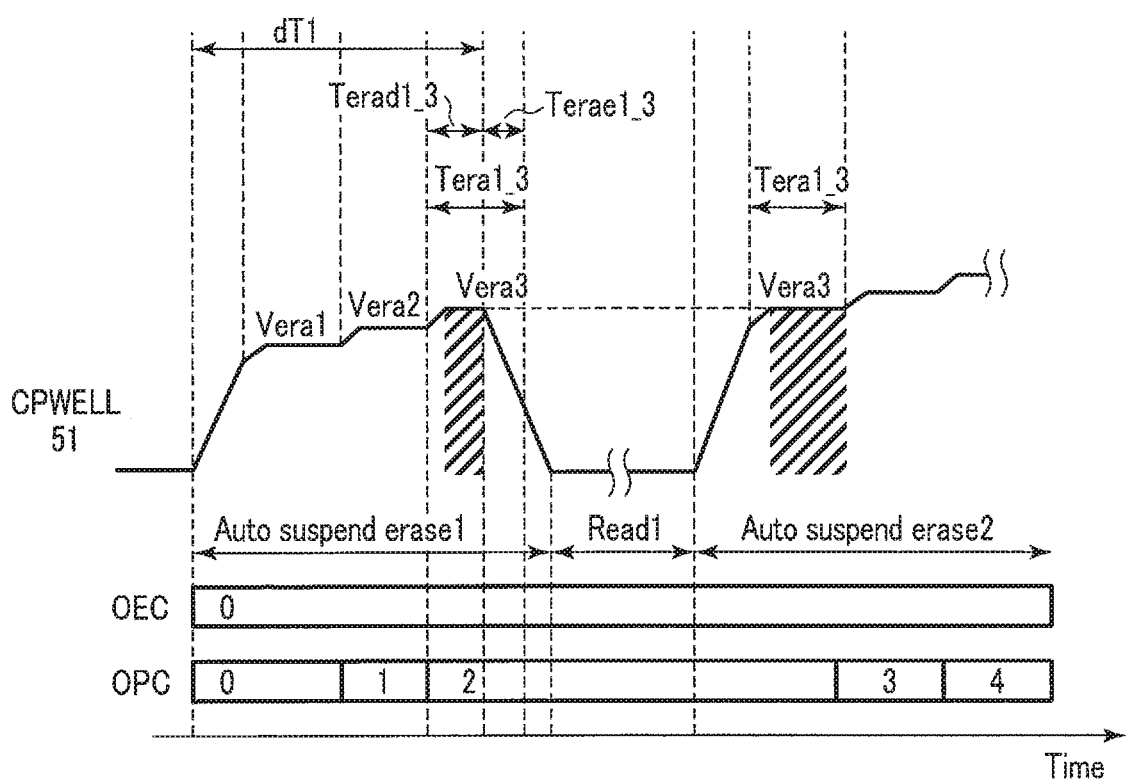
F I G. 11

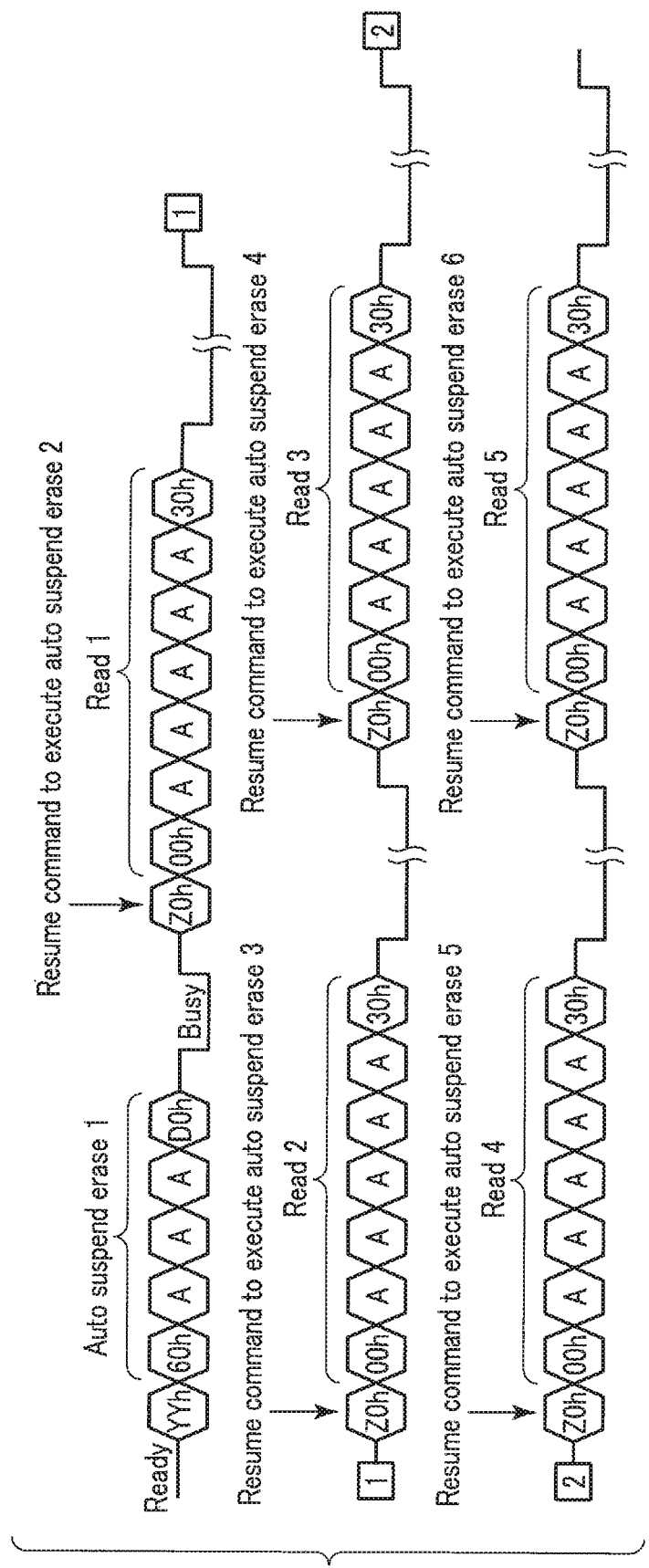
F I G. 13

| SP | OEC | OPC | EVFY |
|---|---|---|---|
| SP1 | 0 | 3 | 0 |
| SP2 | 0 | 6 | 0 |
| SP3 | 0 | 8 | 0 |
| SP4 | 1 | 9 | 1 |
| SP5 | 2 | 9 | 1 |
| SP6 | 3 | 9 | 1 |
| SP7 | 4 | 9 | 1 |

FIG. 14

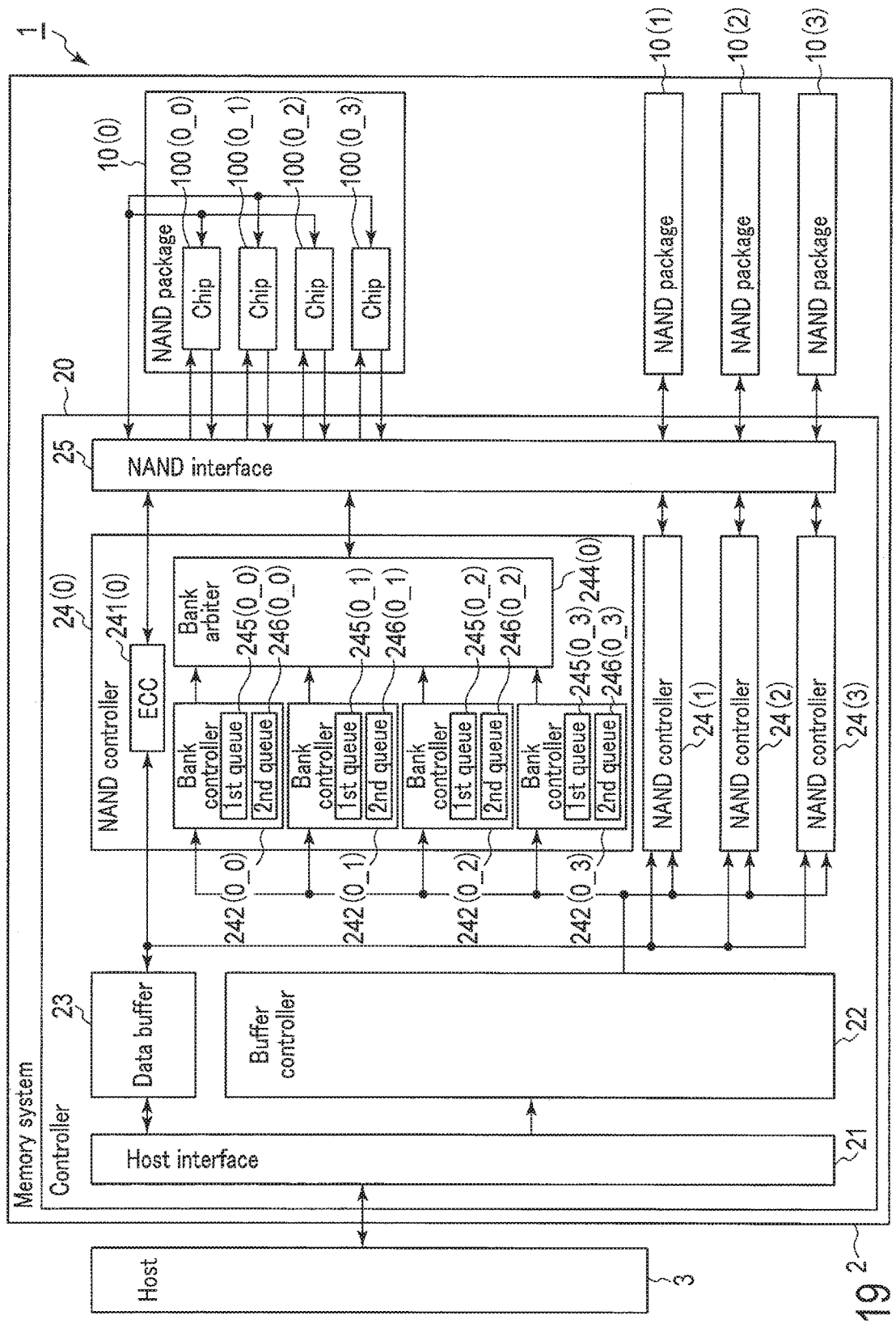
F I G. 19

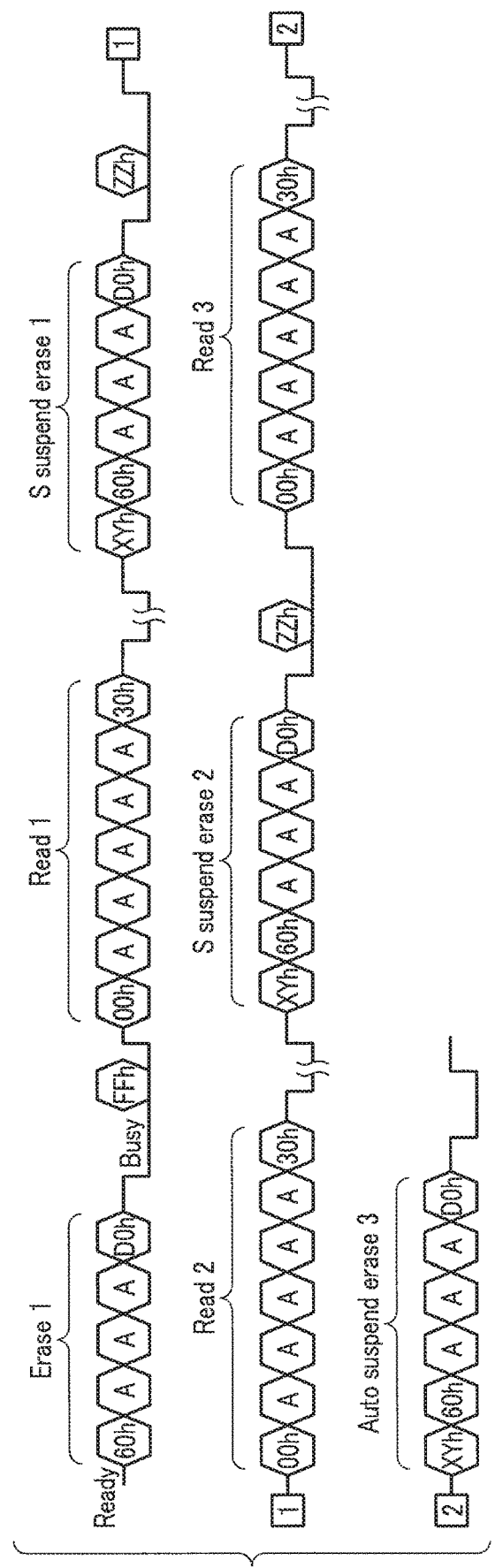
F I G. 24

| e_index (s_index) | Suspend candidate point SPS | Internal Operation | Period T | OEC | OPC | Evfy |
|---|---|---|---|---|---|---|
| 0 | SPS 0 | Before "Erase 1 operation" | 0 | 0 | 00 | 0 |
| 1 | SPS 1 | After executing first step of "Erase 1 operation" | Tera1_1+Ts (+Tr if SPS1 is SP) | 0 | 01 | 0 |
| 2 | SPS 2 | After executing second step of "Erase 1 operation" | Tera1_2 (+Ts if SPS1 is SP; +Tr if SPS2 is SP) | 0 | 02 | 0 |
| 3 | SPS 3 | After executing third step of "Erase 1 operation" | Tera1_3 (+Ts if SPS1 is SP; +Tr if SPS3 is SP) | 0 | 03 | 0 |
| ... | ... | ... | ... | ... | ... | ... |
| 8 | SPS 8 | After executing eighth step of "Erase 1 operation" | Tera1_8 (+Ts if SPS1 is SP; +Tr if SPS8 is SP) | 0 | 08 | 0 |
| 9 | SPS 9 | After executing ninth step of "Erase 1 operation" | Tera1_9 (+Ts if SPS1 is SP; +Tr if SPS9 is SP) | 1 | 09 | 1 |
| 10 | SPS 10 | After "Erase verify 1 operation" | Tevfy1 (+Tr if one of SPS1–SPS8 is a SP immediately preceding) | 1 | 09 | 0 |
| 11 | SPS 11 | After "Erase 2 operation" | Tera2+Ts (+Tr if SPS11 is SP) | 2 | 09 | 1 |
| 12 | SPS 12 | After "Erase verify 2 operation" | Tevfy2 (+Tr if one of SPS1–SPS10 is a SP immediately preceding) | 2 | 09 | 0 |
| 13 | SPS 13 | After "Erase 3 operation" | Tera3+Ts (+Tr if SPS13 is SP) | 3 | 09 | 1 |
| 14 | SPS 14 | After "Erase verify 3 operation" | Tevfy3 (+Tr if one of SPS1–SPS12 is a SP immediately preceding) | 3 | 09 | 0 |
| ... | ... | ... | ... | ... | ... | ... |
| 2t+7 | SPS 2t+7 | After "Erase t operation" | Terat+Ts (+Tr if SPS2t+7 is SP) | t | 09 | 1 |
| 2t+8 | SPS 2t+8 | After "Erase verify t operation" | Tevfyt (+Tr if one of SPS1–SPS2t+6 is a SP immediately preceding) | t | 09 | 0 |

FIG. 28

| SR | OEC | OPC | EVFY | SPR | OEC | OPC | EVFY | SP | OEC | OPC | EVFY |
|---|---|---|---|---|---|---|---|---|---|---|---|
| SR1 | 0 | 00 | 0 | SPR1 | 0 | 01 | 0 | SP1 | 0 | 03 | 0 |
| SR2 | 0 | 01 | 0 | SPR2 | 0 | 02 | 0 | SP2 | 0 | 04 | 0 |
| SR3 | 0 | 02 | 0 | SPR3 | 0 | 03 | 0 | SP3 | 0 | 05 | 0 |
| SR4 | 0 | 03 | 0 | SPR4 | 0 | 04 | 0 | SP4 | 0 | 06 | 0 |
| SR5 | 0 | 04 | 0 | SPR5 | 0 | 05 | 0 | SP5 | 0 | 07 | 0 |
| SR6 | 0 | 05 | 0 | SPR6 | 0 | 06 | 0 | SP6 | 1 | 08 | 0 |
| SR7 | 0 | 06 | 0 | SPR7 | 0 | 07 | 0 | SP7 | 1 | 09 | 1 |

F I G. 30

| e_index (s_index) | SPS | OEC | OPC | EVFY | SRS | OEC | OPC | EVFY |
|---|---|---|---|---|---|---|---|---|
| 1 | SPS1 | 0 | 01 | 0 | SRS1 | 0 | 00 | 0 |
| 2 | SPS2 | 0 | 02 | 0 | SRS2 | 0 | 01 | 0 |
| 3 | SPS3 | 0 | 03 | 0 | SRS3 | 0 | 02 | 0 |
| 4 | SPS4 | 0 | 04 | 0 | SRS4 | 0 | 03 | 0 |
| 5 | SPS5 | 0 | 05 | 0 | SRS5 | 0 | 04 | 0 |
| 6 | SPS6 | 0 | 06 | 0 | SRS6 | 0 | 05 | 0 |
| 7 | SPS7 | 0 | 07 | 0 | SRS7 | 0 | 06 | 0 |

STORAGE DEVICE

CROSS-REFERENCE TO RELATED APPLICATION

This application is based upon and claims the benefit of priority from prior Japanese Patent Application No. 2016-050252, filed Mar. 14, 2016; the entire contents of which are incorporated herein by reference.

FIELD

Embodiments described herein relate generally to a storage device.

BACKGROUND

There is known a NAND flash memory in which memory cells are three-dimensionally arranged.

BRIEF DESCRIPTION OF THE DRAWINGS

FIG. 1 is a view illustrating the configuration of a memory system including a semiconductor storage device.

FIG. 2 is a block diagram of a chip.

FIG. 4 is a view illustrating the configuration of the memory cell array.

FIG. 6 is a waveform diagram at a time of a data erase operation.

FIG. 8 is a command sequence relating to a concrete example of a data erase operation according to the first embodiment.

FIG. 11 is a waveform diagram relating to a concrete example of a data erase operation according to a comparative example of the first embodiment.

FIG. 13 is a command sequence relating to a concrete example of a data erase operation according to a modification of the first embodiment.

FIG. 14 is a suspend point table according to a second embodiment.

FIG. 19 is a view illustrating the configuration of a memory system including a semiconductor storage device according to a third embodiment.

FIG. 24 is a waveform diagram relating to a concrete example of a data erase operation according to a modification of the third embodiment.

FIG. 28 is a suspend candidate point table according to a fifth embodiment.

FIG. 30 is a resume suspend point table according to a modification of the fifth embodiment.

FIG. 32 is a suspend candidate point table according to Modification 2 of the fifth embodiment.

DETAILED DESCRIPTION

Figure 3:
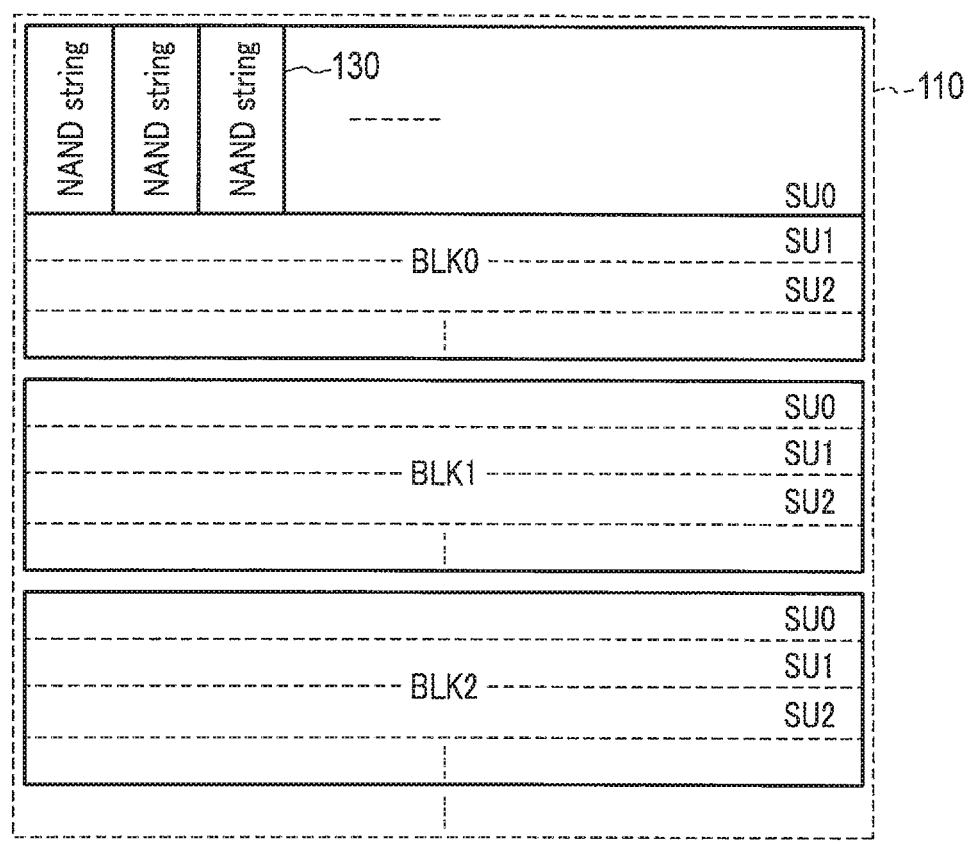
FIG. 3 is a block diagram of a memory cell array.

In general, according to one embodiment, a storage device includes a first memory cell; a second memory cell; and a controller configured to, in response to receiving a first command set, execute a first erase operation which is included in an erase operation of data of the first memory cell, and suspend the first erase operation, and in response to receiving a second command set, execute a read operation or a write operation of the second memory cell and subsequently resume the suspended first erase operation.

Hereinafter, embodiments, which have been constructed, will be described with reference to the accompanying drawings. In the description below, structural elements having substantially the same functions and structures are denoted by like reference signs. A numeral in parentheses after a numeral, which constitutes a reference sign, is used in order to distinguish elements which are referred to by reference signs including the same numeral and have the same structure. When it is not necessary to distinguish elements which are indicated by reference signs including the same numeral, these elements are referred to by a reference sign including only a numeral. For example, when it is not necessary to distinguish elements with reference signs 1(0), 1(1), 1(0_0), 1(0_1), etc., these elements are comprehensively referred to by a reference sign 1.

In addition, each of functional blocks can be realized as hardware, computer software, or a combination of both. Thus, each block will be described below, in general, from the standpoint of the function thereof, so as to make it clear that each block is any one of hardware, computer software, or a combination of both. Whether such a function is implemented as hardware or implemented as software depends on design restrictions which are imposed on a specific embodiment or the entire system. A person skilled in the art may realize these functions by various methods in each of specific embodiments, and to determine such realization is within the scope of the present invention.

<1> First Embodiment

A semiconductor storage device according to a first embodiment is described. Hereinafter, a three-dimensional stacked NAND flash memory, in which memory cell transistors are stacked above a semiconductor substrate, is described as an example of the semiconductor storage device.

<1-1> Configuration of Storage Device

To begin with, the configuration of a storage device including a memory system according to the present embodiment is described with reference to FIG. 1.

As illustrated in FIG. 1, the storage device 1 includes a memory system 2 and a host device 3. The memory system 2 includes a controller 20 and a plurality of NAND packages 10 (in FIG. 1, four NAND packages 10(0) to 10(3)). The memory system 2 may be configured to further include the host device 3. Needless to say, the number of NAND packages 10 is arbitrary.

The NAND package 10(0) includes a plurality of chips (NAND flash memories) 100 (in FIG. 1, four chips 100(0_0) to 100(0_3). The other NAND packages 10 have the same configuration. The details of the configuration of the chip 100 will be described later. Needless to say, the number of chips 100 is arbitrary.

<1-1-1> Configuration of Controller

The controller 20 instructs read, write, erase, etc. to the NAND packages 10, in response to an instruction from the host device 3.

The controller 20 includes a host interface circuit 21, a buffer controller 22, a data buffer 23, a plurality of NAND controllers 24 (in FIG. 1, four NAND controllers 24(0) to 24(3)), and a NAND interface circuit 25.

<1-1-1-1> Configuration of Host Interface Circuit

The host interface circuit 21 is connected to the host device 3 via a controller bus, and manages communication between the controller 20 and host device 3. In addition, the host interface circuit 21 transfers instructions and data, which the host interface circuit 21 have received from the host device 3, to the buffer controller 22 and data buffer 23. Besides, the host interface circuit 21 transfers data in the data buffer 23 to the host device 3. Incidentally, in the present specification, "connection" means either "physical connection" or "electrical connection".

<1-1-1-2> Configuration of Buffer Controller

The buffer controller 22 controls the NAND controllers 24, based on instructions received via the host interface circuit 21.

<1-1-1-3> Configuration of Data Buffer

The data buffer 23 stores data which is to be written to the NAND package 10, or data which was read from the NAND package 10.

<1-1-1-4> Configuration of NAND Controller

The NAND controller 24 is provided in association with each of the NAND packages 10. Thus, in the example of FIG. 1, NAND controllers 24(0) to 24(3) are provided so as to correspond to the NAND packages 10(0) to 10(3).

The NAND controller 24(0) includes an ECC circuit 241(0), a plurality of bank controllers 242 (in FIG. 1, four bank controllers 242), and a bank arbiter 244(0).

The ECC circuit 241 executes a data error correction (ECC: Error Checking and Correcting) process. Specifically, the ECC circuit 241 generates parity, based on write data, at a time of data write. In addition, at a time of data read, the ECC circuit 241 detects an error by generating a syndrome from the parity, and corrects the error.

The bank controller 242 is provided in association with each of the chips 100. Thus, in the example of FIG. 1, bank controllers 242(0_0) to 242(0_3) are provided so as to correspond to the chips 100(0_0) to 100(0_3).

The bank controller 242 controls the chip 100 via the bank arbiter 244(0) and NAND interface circuit 25.

The bank controller 242 recognizes a "ready" state or a "busy" state of the chip 100.

The bank controllers 242 include queues 243 (243(0_0) to 243(0_3)), respectively. The queue 243 sequentially outputs to the chip 100 command sets (which may be simply referred to as "commands") which is supplied from the buffer controller 22, based on an instruction of the bank controller 242. In short, the queue 243 (0_0) is a FIFO (first-in first-out) circuit. The other bank controllers 242 have the same configuration. The bank controller 242 issues commands via the queue 243, when the chip 100 is in the "ready" state.

The bank arbiter 244(0) transmits commands to the corresponding chips 100, based on instructions of the bank controllers 242(0_0) to 242(0_3).

In the above, the NAND controller 24(0) has been described. However, the other NAND controllers 24 have the same configuration.

<1-1-1-5> Configuration of NAND Interface Circuit

The NAND interface circuit 25 is connected to the NAND packages 10 via a NAND bus. The NAND interface circuit 25 manages communication between the NAND package 10 and the controller 20. The NAND interface circuit 25 transfers instructions, which the NAND interface circuit 25 has received via the buffer controller 22, to the NAND packages 10. At a data write time, the NAND interface circuit 25 transfers write data in the data buffer 23 to the NAND package 10. At a data read time, the NAND interface circuit 25 transfers data, which was read from the NAND package 10, to the data buffer 23.

<1-1-2> Configuration of Chip

Next, referring to FIG. 2 and FIG. 3, the configuration of the chip 100 is described.

As illustrated in FIG. 2, the controller 20 and chip 100 are connected via an input/output interface 101 and a control signal input interface 102.

The input/output interface 101 includes a plurality of pads (not shown). The input/output interface 101 receives data, commands and addresses from the controller 20 via the plural pads, and transmits data and data strobe signals DQS and BDQS (a complementary signal of DQS) to the controller 20.

The input/output interface 101 generates the data strobe signals DQS and BDQS. The input/output interface 101 outputs data, together with the data strobe signals DQS and BDQS, to the controller 20 via data input/output lines (DQ0 to DQ7). In addition, the controller 20 receives data from the data input/output lines in accordance with the timing of the data strobe signals DQS and BDQS. The data input/output lines are connected to the pads of the input/output interface 101.

The control signal input interface 102 includes a plurality of pads (not shown). The control signal input interface 102 receives, from the controller 20 via the plural pads, a chip enable signal BCE (Bar chip enable), a command latch enable signal CLE (Command latch enable), an address latch enable signal ALE (Address latch enable), a write enable signal BWE (Bar write enable), read enable signals RE (Read enable) and BRE (Bar read enable), a write protect signal BWP (Bar write protect), and data strobe signals DQS and BDQS.

Although not illustrated in FIG. 2, the chip 100 is also provided with an R/B pad for indicating an internal operation state of the chip 100, and a Vcc/Vss/Vccq/Vssq pad for power supply.

An input/output control circuit 103 outputs data, which was read from a memory cell array 110, to the controller 20 via the input/output interface 101. The input/output control circuit 103 receives, via the input/output interface 101, various commands of write, read, erase and status read, addresses, and write data.

A register 104 outputs a command, which is input from the input/output control circuit 103, to a control circuit 106.

A logic control circuit 105 supplies a control signal, which is input via the control signal input interface 102, to the input/output control circuit 103 and control circuit 106.

The control circuit 106 controls the memory cell array 110, a sense amp 111, a data register 112, a column decoder 113, and a row decoder 115.

The control circuit 106 executes a control operation in accordance with a control circuit which is input from the logic control circuit 105, and a command which is input via the register 104.

The register 104 latches, for example, an address supplied from the controller 20. In addition, the register 104 converts the latched address to an internal physical address, supplies a column address to the column decoder 113, and supplies a row address to the row decoder 114.

The register 104 stores various states in the inside of the chip 100.

In the present embodiment, the input/output control circuit 103, logic control circuit 105 and control circuit 106 are comprehensively treated as a sequencer 120. Although the input/output control circuit 103, logic control circuit 105 and control circuit 106 are described as different structural elements, these elements may be realized by single hardware.

Next, referring to FIG. 3, the memory cell array 110 is described. As illustrated in FIG. 3, the memory cell array 110 includes a plurality of nonvolatile memory cell transistors, and each of the nonvolatile memory cell transistors is associated with a word line and a bit line. In addition, the memory cell array 110 includes a plurality (three in the example of FIG. 3) of blocks (BLK0, BLK1, BLK2, . . . ), each of which is a set of nonvolatile memory cell transistors. The block BLK is, for example, an erase unit of data, and data in the same block BLK is erased batchwise.

The erase of data can be executed by a unit of the block BLK, or by a unit smaller the block BLK. The method of erase is disclosed, for example, in U.S. patent application Ser. No. 13/235,389 filed Sep. 18, 2011 and entitled "NON-VOLATILE SEMICONDUCTOR MEMORY DEVICE". In addition, the method of erase is disclosed in U.S. patent application Ser. No. 12/694,690 filed Jan. 27, 2010 and entitled "NON-VOLATILE SEMICONDUCTOR STORAGE DEVICE". Besides, the method of erase is disclosed in U.S. patent application Ser. No. 13/483,610 filed May 30, 2012 and entitled "NONVOLATILE SEMICONDUCTOR MEMORY DEVICE AND DATA ERASE METHOD THEREOF". The entirety of these patent applications is incorporated in the present specification by reference.

Each of the blocks BLK includes a plurality of string units SU (SU0, SU1, SU2, . . . ), each of which is a set of NAND strings 130 in which memory cell transistors are connected in series. Needless to say, the number of blocks in the memory cell array 110 and the number of string units in one block BLK are arbitrary. An element, which indicates the physical location of a block in the memory cell array 110, is referred to as "block address".

Referring back to FIG. 2, the sense amp 111, data register 112, column decoder 113 and row decoder 114 are described.

At a time of a data read operation, the sense amp 111 senses data which was read from a memory cell transistor MC to a bit line BL.

The data register 112 is composed of an SRAM or the like. The data register 112 stores, for instance, data supplied from the memory controller 20, and a verify result which was sensed by the sense amp 111.

The column decoder 113 decodes a column address signal which is input from the register 104, and outputs a select signal, which selects any one of the bit lines BL, to the sense amp 111.

The row decoder decodes a row address signal which is input from the register 104. In addition, the row decoder 114 selects a word line WL and a select gate line SGD, SGS of the memory cell array 110.

<1-1-3> Configuration of Memory Cell Array

Next, the configuration of the block BLK is described with reference to FIG. 4. As illustrated in FIG. 4, the block BLK includes, for example, four string units SU (SU0 to SU3). In addition, each string unit SU includes a plurality of NAND strings 130.

Each of the NAND strings 130 includes, for example, 48 memory cell transistors MT (MT0 to MT47), and select transistors ST1 and ST2. The memory cell transistor MT includes a control gate and a charge storage layer, and stores data nonvolatilely. In addition, the plural memory cell transistors MT are connected in series between the source of the select transistor ST1 and the drain of the select transistor ST2.

The gates of the select transistors ST1 in the respective string units SU0 to SU3 are connected to select gate lines SGD0 to SGD3. The gates of the select transistors ST2 in the respective string units SU0 to SU3 are connected to select gate lines SGS0 to SGS3. However, the gates of the select transistors ST2 in the respective string units SU0 to SU3 may be commonly connected to, for example, a select gate line SGS. In addition, the control gates of the memory cell transistors MT0 to MT47 in the same block BLK are commonly connected to word lines WL0 to WL47.

Furthermore, the drains of the select transistors ST1 of the NAND strings 130 in the same column in the memory cell array 110 are commonly connected to a bit line BL (BL0 to BL(L-1); (L-1) is a natural number of two or more). Specifically, the bit line BL commonly connects the NAND strings 130 between plural blocks BLK. Besides, the sources of plural select transistors ST2 are commonly connected to a source line SL.

Figure 5:
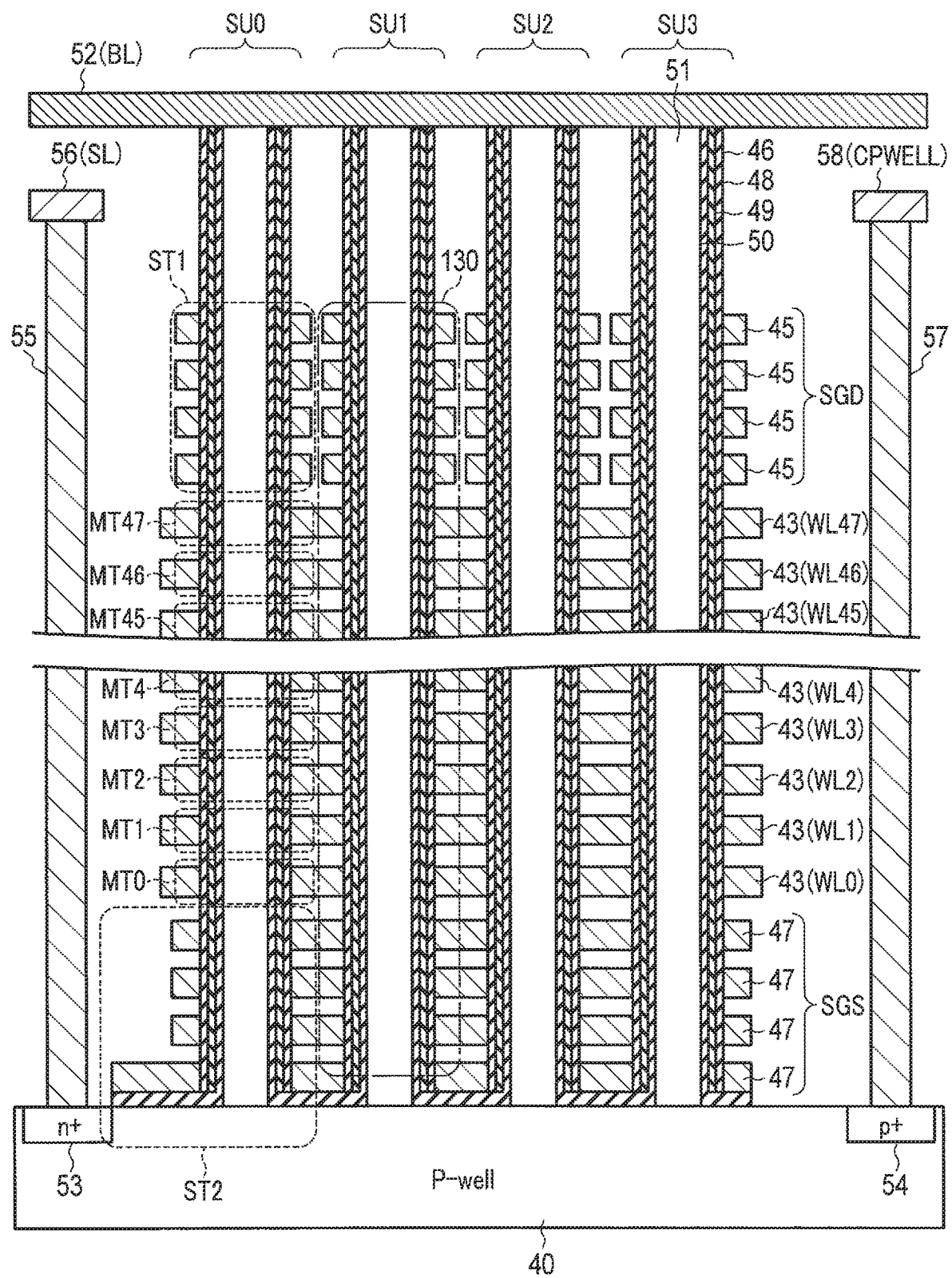
FIG. 5 is a cross-sectional view of the memory cell array.

FIG. 5 is a cross-sectional view of a partial region of the block BLK. As illustrated in FIG. 5, a plurality of NAND strings 130 are formed on a p-well region 40. Specifically, for example, four interconnect layers 47 functioning as select gate lines SGS, 48 interconnect layers 43 functioning as word lines WL, and, for example, four interconnect layers 45 functioning as select gate lines SGD are successively stacked on the well region 40. Insulating films (not shown) are formed between the stacked interconnect layers.

In addition, a pillar-shaped semiconductor 51, which penetrates the interconnect layers 45, 43 and 47 and reaches the well region 40, is formed. A gate insulating film 50, a charge storage layer (insulating film or semiconductor film) 49 and a block insulating film 48 are successively formed on a side surface of the semiconductor 51, and the memory cell transistors MT and select transistors ST1 and ST2 are formed by these elements. The semiconductor 51 functions as a current path of the NAND string 130, and serves as a region where a channel of each transistor is formed. In addition, an upper end of the semiconductor 51 is connected to a metal interconnect layer 52 functioning as a bit line BL.

An $n^+$-type impurity diffusion layer 53 is formed in a surface region of the well region 40. A contact plug 55 is formed on the diffusion layer 53, and the contact plug 55 is connected to a metal interconnect layer 56 functioning as a source line SL. Further, a $p^+$-type impurity diffusion layer 54 is formed in a surface region of the well region 40. A contact plug 57 is formed on the diffusion layer 54, and the contact plug 57 is connected to a metal interconnect layer 58 functioning as a well interconnect CPWELL. The well interconnect CPWELL is an interconnect for applying a potential to the semiconductor 51 via the well region 40.

A plurality of the above-described structures are arranged in the depth direction of the drawing sheet of FIG. 5, and the string unit SU is formed by a set of NAND strings 130 which are arranged in the depth direction.

Besides, the memory cell array 110 may have other configurations. Specifically, the configuration of the memory cell array 110 is disclosed, for example, in U.S. patent application Ser. No. 12/407,403 filed Mar. 19, 2009 and entitled "THREE DIMENSIONAL STACKED NON-VOLATILE SEMICONDUCTOR MEMORY". In addition, the configuration of the memory cell array 110 is disclosed in U.S. patent application Ser. No. 12/406,524 filed Mar. 18, 2009 and entitled "THREE DIMENSIONAL STACKED NONVOLATILE SEMICONDUCTOR MEMORY", U.S. patent application Ser. No. 12/679,991 filed Mar. 25, 2010 and entitled "NONVOLATILE SEMICONDUCTOR STORAGE DEVICE AND MANUFACTURING METHOD THEREOF", and U.S. patent application Ser. No. 12/532,030 filed Mar. 23, 2009 and entitled "SEMICONDUCTOR MEMORY AND METHOD FOR MANUFACTURING SAME". The entirety of these patent applications is incorporated in the present specification by reference.

<1-2> Operation

<1-2-1> Data Erase Operation

Next, a data erase operation according to the present embodiment is described. In the description below, a data erase operation, which is executed mainly by the sequencer 120, is described by way of example. However, the data erase operation may be executed mainly by the controller 20.

Potentials of various interconnects at a time of the data erase operation are described with reference to FIG. 6.

The data erase operation is executed by repeating an erase (Erase) operation and an erase verify (Erase verify) operation. For example, the "Erase" operation is executed by a unit of plural NAND strings 130 (e.g. all string units SU in the block), and the "Erase verify" operation is executed by a unit of each string unit SU. In the data erase operation, the "Erase" operation is first executed.

<1-2-1-1> "Erase 1" Operation

The sequencer 120 executes a first erase (Erase 1) operation.

At a time of the start of the data erase operation, the sequencer 120 sets a selected select gate line (a source-side select gate line of a selected block) SGS(sel) and a selected word line (a word line of a selected block) WL(sel) at a ground voltage "VSS". In the meantime, the sequencer 120 sets in a floating state a source line SL, a selected select gate line (a drain-side select gate line of the selected block) SGD(sel), a bit line BL, a non-selected word line (a word line of a non-selected block) WL(n-sel), a non-selected select gate line (a drain-side select gate line of the non-selected block) SGD(n-sel), and a non-selected select gate line (a source-side select gate line of the non-selected block) SGS(n-sel). The sequencer 120 may set the non-selected select gate line SGD(n-sel) and non-selected select gate line SGS(n-sel) at the ground voltage "VSS". The following description will be given on the assumption that the non-selected select gate line SGD(n-sel) and non-selected select gate line SGS(n-sel) are in the floating state.

[Time Instant "Ta0"]

The sequencer 120 raises the potential of the well interconnect CPWELL from voltage "VSS" to voltage "Vera1". The sequencer 120 raises the potential of the selected select gate line SGS(sel) from voltage "VSS" to voltage "Verag1" (Vera1>Verag1). Then, the potential of the semiconductor (also referred to as "selected semiconductor") 51 of a selected NAND string (a NAND string of the selected block) 130 is raised.

The sequencer 120 raises the potential of the selected word line WL(sel) from voltage "VSS" to voltage "VE" (e.g. 0 to 0.5 V).

[Time Instant "Ta1"]

The sequencer 120 raises the potential of the well interconnect CPWELL up to voltage "Vera1", and keeps voltage "Vera1". In addition, the sequencer 120 raises the potential of the selected select gate line SGS(sel) up to voltage "Verag1", and keeps voltage "Verag1".

The potentials of the non-selected word line WL(n-sel), non-selected select gate line SGD(n-sel) and non-selected select gate line SGS(n-sel) are raised by capacitive coupling between the well interconnect CPWELL and selected semiconductor 51.

[Time Instant "Ta2"]

The sequencer 120 raises the potential of the well interconnect CPWELL up to voltage "Vera2" (Vera2=Vera1+dVera), and keeps voltage "Vera2". In addition, the sequencer 120 raises the potential of the selected select gate line SGS(sel) up to voltage "Verag2" (Vera2>Verag2=Verag1+dVera), and keeps voltage "Verag2". Accordingly, the potential of the semiconductor 51 in the selected NAND string is raised.

The potentials of the non-selected word line WL(n-sel) and non-selected select gate lines SGD(n-sel) and SGS(n-sel) are raised by capacitive coupling between the well interconnect CPWELL and selected semiconductor 51.

As described above, if the sequencer 120 raises (steps up) the voltage, which is applied to the well interconnect CPWELL, by voltage "dVera", the sequencer 120 counts up step-up information (hereinafter referred to as "OPC") relating to a data erase area, which is stored in the register 104, from "0" to "1". The OPC is step-up information in the first erase operation (Erase 1). Specifically, in the first erase operation (Erase 1), each time the voltage applied to the well interconnect CPWELL is raised by "dVera", the sequencer 120 counts up the OPC stored in the register 104 by "1". Also in the case in which the number of times of step-up of the voltage, which is applied to the well interconnect CPWELL, has reached a preset upper limit (stored in the register 104; "8" in this example), the sequencer 120 counts up the OPC.

[Time Instant "Ta3" to Time Instant "Ta9"]

The sequencer 120 repeats the same operation as described in connection with the time instant "Ta2", while stepping up the voltages applied to the well interconnect CPWELL and selected select gate line SGS(sel) in units of voltage "dVera".

In the present embodiment, until the OPC stored in the register 104 reaches "A" (A is an integer; "8" in this example), the sequencer 120 steps up the voltage of the well interconnect CPWELL in units of voltage "dVera".

[Time Instant "Ta10"]

If the voltage application operation relating to OPC=8 (upper limit) is completed, the sequencer 120 lowers the potential of the well interconnect CPWELL from voltage "Vera9" (Vera9=Vera1+8*dVera) to voltage "VSS". In addition, the sequencer 120 lowers the potential of the selected select gate line SGS(sel) from voltage "Verag9" (Vera9>Verag9=Verag1+8*dVera) to voltage "VSS". Accordingly, the potential of the semiconductor 51 in each NAND string is lowered.

In addition, the potentials of the non-selected word line WL(n-sel) and non-selected select gate lines SGD(n-sel) and SGS(n-sel) are lowered by capacitive coupling between the well interconnect CPWELL and selected semiconductor 51.

At time instant "Ta10", the sequencer 120 counts up number-of-times-of-erase information (hereinafter referred to as "OEC") relating to an erase area, which is stored in the register 104, from "O" to "1". Each time the "Erase" operation ends, the sequencer 120 counts up the OEC. Furthermore, with the OEC being counted up, the sequencer 120 counts up the OPC stored in the register 104 from "8" to "9".

In the above-described manner, the first erase (Erase 1) operation ends. As described above, the sequencer 120 steps up the application voltage in units of "dVera", only in the case of the "Erase 1" operation. Needless to say, aside from this, the application voltage may be stepped up in second and subsequent "Erase" operations.

<1-2-1-2> "Erase Verify 1" Operation

After the "Erase 1" operation, an erase verify operation is executed. Specifically, at time instant "Ta11", the sequencer 120 executes a first erase verify (Erase verify 1) operation. As described above, the sequencer 120 executes the "Erase verify 1" operation for each string unit SU.

If the sequencer 120 determines that the results of the "Erase verify 1" operations of all string units SU in the selected block are "pass", the sequencer 120 terminates the data erase operation. If the sequencer 120 determines that the results of the "Erase verify 1" operations of all string units SU in the selected block are not "pass" (also referred to as "fail"), the sequencer 120 continues the data erase operation. Specifically, the sequencer 120 executes a second erase (Erase 2) operation.

<1-2-1-3> "Erase 2" Operation

[Time Instant "Ta12"]

When the sequencer 120 executes the "Erase 2" operation, the sequencer 120 raises the potential of the well interconnect CPWELL from voltage "VSS" to voltage "Vera10" (Vera10=Vera9+dVera2). In addition, the sequencer 120 raises the potential of the selected select gate line SGS(sel) from voltage "VSS" to voltage "Verag10" (Vera10>Verag10=Verag9+dVera2).

[Time Instant "Ta13"]

The sequencer 120 raises the potential of the well interconnect CPWELL up to voltage "Vera10", and keeps voltage "Vera10". The sequencer 120 raises the potential of the selected select gate line SGS(sel) up to voltage "Verag10", and keeps voltage "Verag10".

Accordingly, the potential of the semiconductor 51 in the selected NAND string 130 is raised.

In addition, the potentials of the non-selected word line WL(n-sel) and non-selected select gate lines SGD(n-sel) and SGS(n-sel) are raised by capacitive coupling between the well interconnect CPWELL and selected semiconductor 51.

[Time Instant "Ta14"]

The sequencer 120 lowers the potential of the well interconnect CPWELL from voltage "Vera10" to voltage "VSS". In addition, the sequencer 120 lowers the potential of the selected select gate line SGS(sel) from voltage "Verag10" to voltage "VSS". The potential of the semiconductor 51 in each NAND string is also lowered.

In addition, the potentials of the non-selected word line WL(n-sel) and non-selected select gate lines SGD(n-sel) and SGS(n-sel) are lowered by capacitive coupling between the well interconnect CPWELL and selected semiconductor 51. In the above-described manner, the second erase (Erase 2) operation ends. The sequencer 120 counts up the OEC from "1" to "2".

<1-2-1-4> "Erase Verify 2" Operation

After the "Erase 2" operation, an erase verify operation is executed. Specifically, at time instant "Ta15", the sequencer 120 executes a second erase verify (Erase verify 2) operation.

If the sequencer 120 determines that the results of the "Erase verify 2" operations of all string units SU in the selected block are "pass", the sequencer 120 terminates the data erase operation as such. If the sequencer 120 determines that the results of the "Erase verify 2" operations of all string units SU in the selected block are not "pass", the sequencer 120 continues the data erase operation. Specifically, the sequencer 120 executes a third erase (Erase 3) operation.

In the "Erase 3" operation, the same operation as the "Erase 2" operation is executed. Thereafter, an "Erase verify 3" operation, which is the same as the "Erase verify 2" operation, is executed.

<1-2-1-5> "Erase n" Operation

For example, if the sequencer 120 determines that the result of an (n−1)th (n is an integer of 2 or more) erase verify (Erase verify n−1) operation is "fail", the sequencer 120 executes an n-th erase (Erase n) operation.

[Time Instant "Tah (h is an Integer)"]

In the case of the "Erase n" operation, the sequencer 120 raises the potential of the well interconnect CPWELL from voltage "VSS" to voltage "Verai" (Verai=Vera9+(n−1)*dVera2). In addition, the sequencer 120 raises the potential of the selected select gate line SGS(sel) from voltage "VSS" to voltage "Veragi" (Verai>Veragi=Verag9+(n−1)*dVera2).

[Time Instant "Tah+1"]

The sequencer 120 raises the potential of the well interconnect CPWELL up to voltage "Verai", and keeps voltage "Verai". In addition, the sequencer 120 raises the potential of the selected select gate line SGS(sel) up to voltage "Veragi", and keeps voltage "Veragi".

Besides, the potentials of the non-selected word line WL(n-sel), non-selected select gate lines SGD(n-sel) and SGS(n-sel) are raised by capacitive coupling between the well interconnect CPWELL and selected semiconductor 51.

[Time Instant "Tah+2"]

The sequencer 120 lowers the potential of the well interconnect CPWELL from voltage "Verai" to voltage "VSS". In addition, the sequencer 120 lowers the potential of the selected select gate line SGS(sel) from voltage "Veragi" to voltage "VSS". Accordingly, the potential of the semiconductor 51 in the selected NAND string is also lowered.

In addition, the potentials of the non-selected word line WL(n-sel) and non-selected select gate lines SGD(n-sel) and SGS(n-sel) are lowered by capacitive coupling between the well interconnect CPWELL and selected semiconductor 51. In the above-described manner, the n-th erase (Erase n) operation ends. The sequencer 120 counts up the OEC from "n−1" to "n".

<1-2-1-6> "Erase Verify n" Operation

At time instant "Tah+3", an n-th erase verify (Erase verify n) is executed.

If the sequencer 120 determines that the results of the "Erase verify n" operations of all string units SU in the selected block are "pass", the sequencer 120 terminates the data erase operation as such. If the sequencer 120 determines that the results of the "Erase verify n" operations of all string units SU in the selected block are not "pass" (also referred to as "fail"), the sequencer 120 continues the data erase operation.

In the above-described manner, in the data erase operation, until the results of the "Erase verify n" operations for all string units SU in the selected block become "pass", the sequencer 120 repeats the "Erase" operation and "Erase verify" operation. Incidentally, the sequencer 120 may set an upper limit to the number of times of repetition of the "Erase" operation and "Erase verify" operation.

<1-2-2> Auto Suspend Erase Operation

As described above with reference to FIG. 6, there is a case in which the voltage application operation ("Erase" operation) to the well interconnect CPWELL is repeated until the data erase operation is completed. In such a case, it is possible that the time needed for the data erase operation becomes longer. For example, there is a case in which the time needed until completion of the data erase operation becomes about 5 msec. Specifically, during this time period, the chip 100 is in the "busy" state, and the controller 20 cannot access the chip 100.

For example, in some cases, the memory system 2 receives an instruction with high priority, while executing the data erase operation. However, the memory system 2 cannot execute this instruction until the data erase operation is completed. From the standpoint of the processing speed of the memory system 2, there is a possibility that it is not preferable to wait for the execution of the instruction until the data erase operation is completed. Thus, there is a demand for such a data erase operation that the chip 100 enters the "ready" state if a predetermined time (a time shorter than 5 msec) has passed.

Thus, in the present embodiment, an auto suspend erase (Auto Suspend erase) operation, which divides the data erase operation into a plurality of divisions (e.g. in units of about 1 msec), is executed. In the case of adopting the "Auto Suspend erase" operation, if a substantially fixed time (a time shorter than 5 msec) has passed, the chip 100 enters the "ready" state. Specifically, by dividing the data erase operation into divisions, the wait time for the execution of the above-described instruction can be decreased. Hereinafter, an "Auto Suspend erase" operation, which is executed by the chip 100(0_0), is described by way of example.

Figure 7:
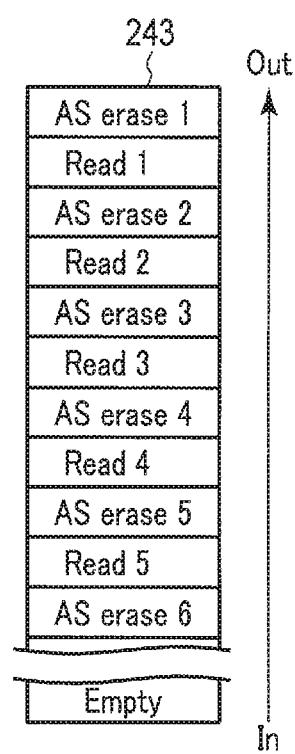
FIG. 7 is a diagram of a queue according to a first embodiment.

As illustrated in FIG. 7, for example, in a queue 243(0_0), an "Auto Suspend erase" command set ("AS erase" in FIG. 7) and a "READ" command set are alternately input. For example, plural "Auto Suspend erase" command sets illustrated in FIG. 7 are command sets for erasing the same erase area. Since the queue 243 is a FIFO circuit, command sets are issued to the chip 100(0_0) in the order of command sets which were input. In addition, the "Auto Suspend erase" command set and "READ" command set are supplied from, for example, the buffer controller 22. In this embodiment, by way of example, the "Auto Suspend erase" command set and "READ" command set are alternately input in the queue 243(0_0). However, the restriction to this example is unnecessary.

<1-2-3> Concrete Example of Auto Suspend Erase Operation.

Figure 9:
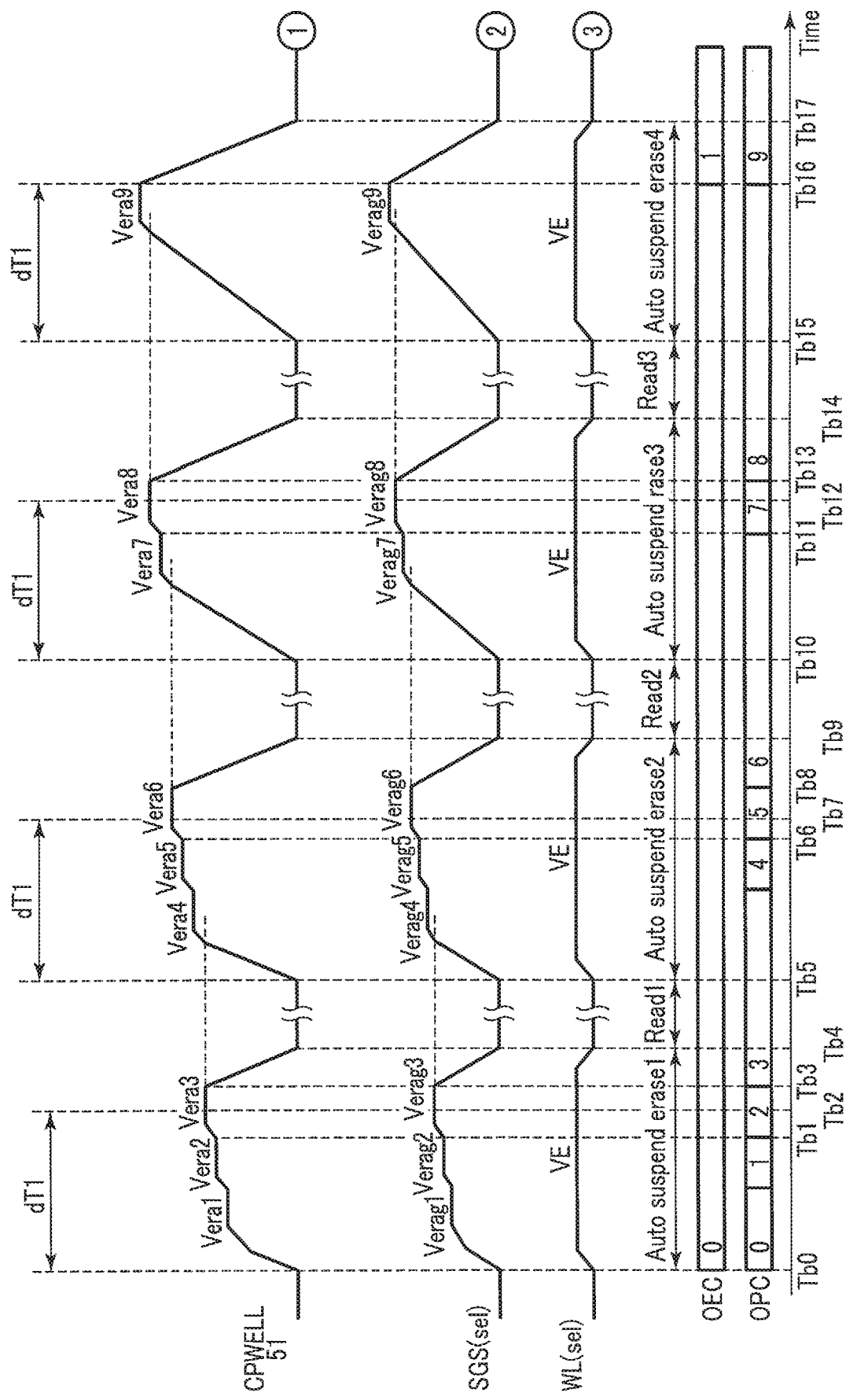
FIG. 9 is a waveform diagram relating to the concrete example of the data erase operation according to the first embodiment.

Next, referring to FIG. 8 and FIG. 9, a description is given of a concrete example of the auto suspend erase operation relating to the queue of command sets illustrated in FIG. 7.

As illustrated in FIG. 7, the bank controller 242(0_0) (hereinafter referred to simply as "bank controller 242" for the purpose of simple description) outputs an "Auto Suspend erase 1" command set, which is stored at the beginning of the queue 243(0_0) (hereinafter referred to simply as "queue 243" for the purpose of simple description), to the chip 100.

As illustrated in FIG. 8, in the "ready" state, the chip 100 successively receives a "YYh" command and a "60h" command as the "Auto Suspend erase 1" command set, and thereafter receives row addresses of three cycles.

Then, if a "D0h" command is input, the chip 100 executes a first auto suspend erase (Auto Suspend erase 1) operation, and enters the "busy" state.

Referring to FIG. 9, a concrete example of the "Auto Suspend erase 1" operation is described.

[Time Instant "Tb0"]

As illustrated in FIG. 9, upon receiving the "D0h" command, the sequencer 120 of the chip 100 executes the "Auto Suspend erase 1" operation during a period "dT1" from "Tb0". As regards the period "dT1", for example, "dT1" is the number of cycles, etc. For example, the sequencer 120 may count "dT1", or a counter may be provided in the chip 100 and this counter may count "dT1". The period "dT1" may be preset for each chip 100, or may be arbitrarily set by a user, etc.

[Time Instant "Tb2"]

At time instant "Tb2" when the period "dT1" has passed since time instant "Tb0", the sequencer 120 is in the course of applying voltage "Vera3" to the well interconnect CPWELL.

In the meantime, in the "Auto Suspend erase", a period, during which predetermined voltages are applied to the well interconnect CPWELL and selected select gate line SGS (sel), is determined. For example, the sequencer 120 is so set as to apply voltage "Vera3" to the well interconnect CPWELL during a period of time instant Tb1 to time instant Tb3.

Thus, until time instant "Tb3", the sequencer 120 applies voltage "Vera3" to the well interconnect CPWELL, and applies voltage "Verag3" to the selected select gate line SGS(sel).

[Time Instant "Tb3"]

From time instant "Tb3" to time instant "Tb4", the sequencer 120 lowers the potentials of the well interconnect CPWELL and the selected select gate line SGS(sel) to voltage "VSS".

Thereby, the "Auto Suspend erase 1" operation ends. In this embodiment, the "Auto Suspend erase 1" operation corresponds to an operation up to a certain point during the above-described "Erase 1".

Then, if the "Auto Suspend erase 1 (Erase 1)" operation ends, the chip 100 enters the "ready" state.

As illustrated in FIG. 7 and FIG. 8, if the chip 100 enters the "ready" state, the bank controller 242 supplies a "READ 1" command set, which is set next to the "Auto Suspend erase 1" command set, to the chip 100.

The chip 100 receives a "00h" command of the "READ 1" command set, and thereafter receives column addresses and row addresses by five cycles. Then, upon receiving "30h", the chip 100 enters the "busy state", and executes a first read (READ 1) operation.

Upon receiving the "30h" command, the sequencer 120 of the chip 100 executes the "READ 1" operation during a period of time instant "Tb4" to time instant "Tb5" in FIG. 9. Then, the chip 100 outputs data and, if the "READ 1" operation ends, the chip 100 enters the "ready state".

If the chip 100 enters the "ready state", the bank controller 242 supplies an "Auto Suspend erase 2" command set, which is set next to the "READ 1" command set, to the chip 100.

As illustrated in FIG. 8, the chip 100 receives an "XXh" command and a "60h" command as the "Auto Suspend erase 2" command set, and thereafter receives row addresses of three cycles. The "XXh" command is a resume command which means that the data erase operation is to be continued. Upon receiving the "XXh" command, the chip 100 executes the continuation of the data erase operation.

Upon receiving a "D0h" command, the chip 100 enters the "busy state", and the chip 100 executes a second auto suspend erase (Auto Suspend erase 2) operation, that is, the chip 100 executes the continuation of the "Auto Suspend erase 1" operation.

[Time Instant "Tb5"]

Upon receiving the "D0h" command, the sequencer 120 of the chip 100 executes the "Auto Suspend erase 2 (Erase 1)" operation from time instant "Tb5" in FIG. 9. Here, at a time point when the period "dT1" has passed since time instant "Tb5", the sequencer 120 is in the course of applying voltage "Vera6" to the well interconnect CPWELL. For example, the sequencer 120 is set to apply voltage "Vera6" to the well interconnect CPWELL during a period of time instant Tb6 to time instant Tb8.

Thus, until time instant "Tb8", the sequencer 120 applies voltage "Vera6" to the well interconnect CPWELL, and applies voltage "Verag6" to the selected select gate line SGS(sel).

[Time Instant "Tb8"]

From time instant "Tb8" to time instant "Tb9", the sequencer 120 lowers the potentials of the well interconnect CPWELL and the selected select gate line SGS(sel) to voltage "VSS".

Thereby, the "Auto Suspend erase 2 (Erase 1)" ends. If the "Auto Suspend erase 2 (Erase 1)" ends, the chip 100 enters the "ready state".

As illustrated in FIG. 7 and FIG. 8, if the chip 100 enters the "ready" state, the bank controller 242 supplies a "READ 2" command set, which is set next to the "Auto Suspend erase 2" command set, to the chip 100.

A "00h" command of the "READ 2" command set is input to the chip 100, and thereafter column addresses and row addresses are input by five cycles. Then, if "30h" is input, the chip 100 enters the "busy state", and executes a second (READ 2) operation.

Upon receiving the "30h" command, the sequencer 120 of the chip 100 executes the "READ 2" operation during a period of time instant "Tb9" to time instant "Tb10" in FIG. 9.

Then, if the "READ 2" operation ends, the chip 100 enters the "ready state".

An "Auto Suspend erase 3" operation, a "READ 3" operation, an "Auto Suspend erase 4" operation and a "READ 4" operation are executed in the same manner as the method described in connection with the "Auto Suspend erase 1" operation and "READ 1" operation.

If the chip 100 enters the "ready state", the bank controller 242 supplies an "Auto Suspend erase 5" command set, which is set next to the "READ 4" command set, to the chip 100.

As illustrated in FIG. 8, the chip 100 receives an "XXh" command and a "60h" command as the "Auto Suspend erase 5" command set, and thereafter receives row addresses of three cycles.

[Time Instant "Tb18"]

At time instant "Tb16", the sequencer 120 increments the OEC. The OEC is incremented if the "Erase" operation ends. In order to determine whether the "Erase 1" operation is completed or not, the sequencer 120 executes an "Erase verify 1" operation. Thus, upon receiving a "D0h" command, the sequencer 120 of the chip 100 starts a first erase verify (Erase verify 1) operation from time instant "Tb18" in FIG. 10. If the "Erase verify 1" operation is "pass", the erase operation relating to the corresponding erase area is finished.

In this embodiment, the case of "fail" in the "Erase verify 1" operation is described. In the case of "fail" in the "Erase verify 1" operation, the chip 100 executes the continuation of the "Auto Suspend erase 4" operation. Specifically, the sequencer 120 executes an "Auto Suspend erase 5" operation, at least until a period "dT1" has passed since time instant "Tb18" in FIG. 10. In addition, in the case of "fail" in the "Erase verify 1" operation, the chip 100 may inform the controller 20 of the "fail in the "Erase verify 1" operation.

Figure 10:
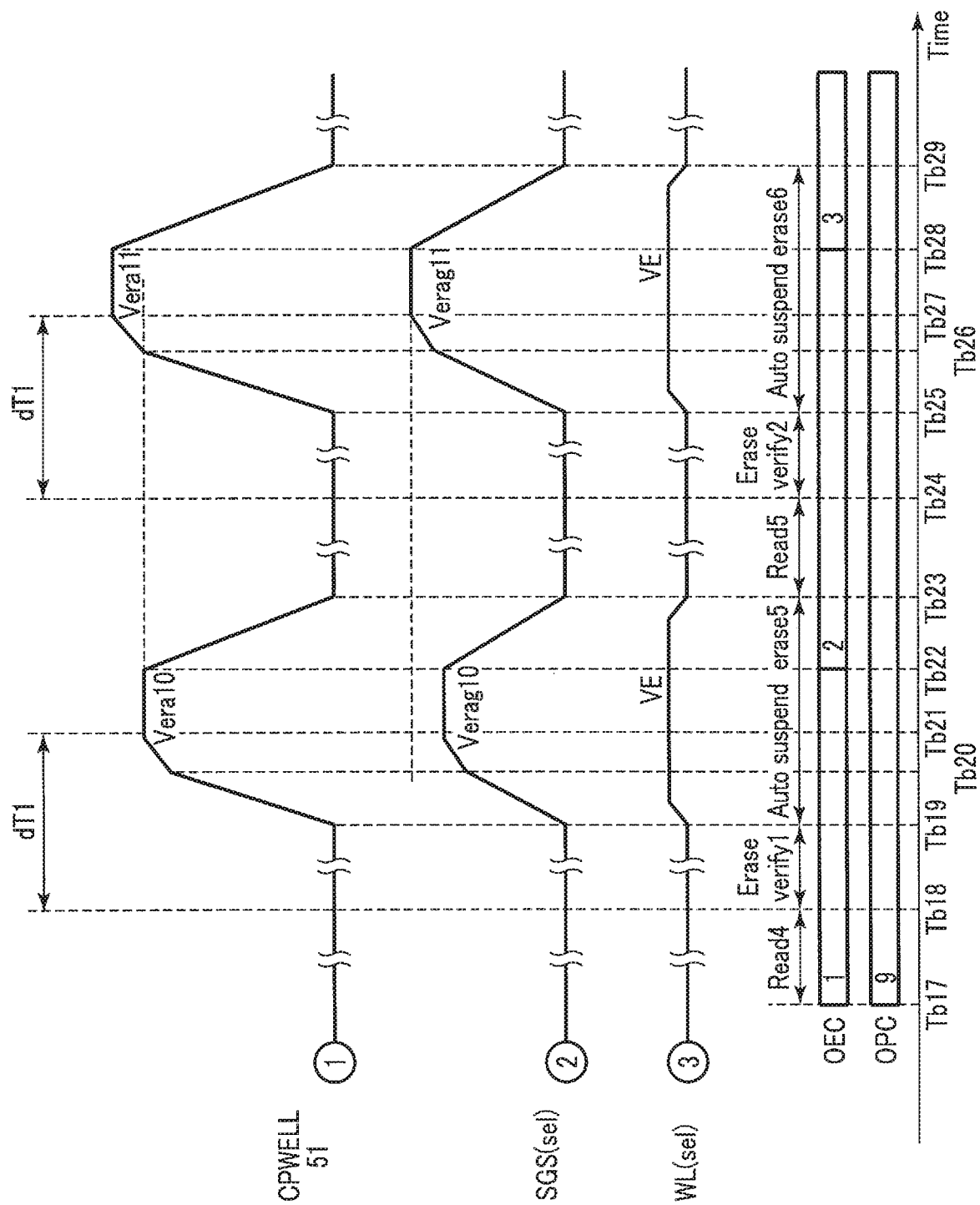
FIG. 10 is a waveform diagram relating to the concrete example of the data erase operation according to the first embodiment.

As illustrated in FIG. 10, at a time point when the period "dT1" has passed since time instant "Tb18", the sequencer 120 is in the course of applying voltage "Vera10" to the well interconnect CPWELL. For example, the sequencer 120 is set to apply voltage "Vera10" to the well interconnect CPWELL during a period of time instant "Tb20" to time instant "Tb22".

Thus, until time instant "Tb22", the sequencer 120 applies voltage "Vera10" to the well interconnect CPWELL, and applies voltage "Verag10" to the selected select gate line SGS(sel).

[Time Instant "Tb22"]

From time instant "Tb22" to time instant "Tb23", the sequencer 120 applies voltage "VSS" to the well interconnect CPWELL and the selected select gate line SGS(sel).

Thereby, the "Auto Suspend erase 5" operation ends.

If the "Auto Suspend erase 5" operation ends, the chip 100 enters the "ready state".

A "READ 5" operation and an "Auto Suspend erase 6" operation are executed by the same method as described in connection with the "READ 4" operation and "Auto Suspend erase 5" operation. In addition, when an "Auto Suspend erase A" (A is an integer of 7 or more) operation is continued for the same erase area, this operation is executed by the same method as in the "Auto Suspend erase 5".

For example, there is a case in which the "Erase" operation is in the course of ending, at a time instant when the period "dT1" has passed since time instant "TbB" (B is an integer) at which the "Auto Suspend erase" operation is started or resumed. In such a case, the sequencer 120 terminates the "Auto Suspend erase" operation.

On the other hand, there is a case in which the sequencer 120 is in the course of applying voltage "Verax" (x is an integer) to the well interconnect CPWELL, at a time point when the period "dT1" has passed since time instant "TbB". In such a case, in order to apply voltage "Verax", the sequencer 120 applies voltage "Verax" during a preset period "Teray" or "Teray_z" (y and z are integers). Thereafter, the sequencer 120 terminates the "Auto Suspend erase" operation. In the present embodiment, the "Auto Suspend erase" operation is executed in the above manner.

The application voltage "Verax" immediately before suspend in the "Auto Suspend erase A" operation is lower than a first application voltage "Verax+1" in an "Auto Suspend erase A+1". The "Auto Suspend erase A" is executed based on a first command, and the "Auto Suspend erase A+1" is executed based on a second mode (a command which is input after the first command).

In this embodiment, the Auto Suspend erase operation, which is executed by the chip 100(0_0), was described by way of example. However, the same operation is executed in the other chips 100.

<1-3> Advantageous Effects

According to the above-described embodiment, when the chip 100 executes the auto suspend erase operation, the chip 100 applies voltage "Verax" to the well interconnect CPWELL, at least up to the preset period "dT1". In addition, there is a case in which at the time point when the period "dT1" has passed, the voltage "Verax" is in the course of being applied to the well interconnect CPWELL. In this case, the chip 100 applies the voltage "Verax" to the well interconnect CPWELL during a predetermined period which is so set as to apply the voltage "Verax" to the well interconnect CPWELL.

Here, a comparative example is described in order to explain the advantageous effects of the above-described embodiment. A chip 100 according to the comparative example applies voltage "Verax" to the well interconnect CPWELL, until a preset period "dT1" has passed since the start time of the "Auto Suspend erase 1" operation. There is a case in which the chip 100 according to the comparative example is in the course of applying the voltage "Verax" to the well interconnect CPWELL at the time point when the period "dT1" has passed. In this case, the chip 100 according to the comparative example immediately lowers the voltage of the well interconnect CPWELL to "VSS", without applying the voltage "Verax" to the well interconnect CPWELL during a predetermined period.

When the applying voltage "Verax" to the well interconnect CPWELL was suspended, the chip 100 of the comparative example is configured to apply once again the voltage "Verax" to the well interconnect CPWELL during a predetermined period.

Referring now to FIG. 11, a concrete example relating to the comparative example is described. As illustrated in FIG. 11, there is a case in which the chip 100 according to the comparative example applies voltage "Vera3" to the well interconnect CPWELL during a period "Terad1_3" (Tera1_3=Terad1_3+Terae1_3). In the meantime, the chip 100 of the comparative example is so set as to apply the voltage "Vera3" during "Tera1_3". Thus, when the chip 100 of the comparative example executes the "Auto Suspend erase 2" operation, the chip 100 applies once again the voltage "Vera3", which was applied halfway, to the well interconnect CPWELL during the predetermined period "Tera1_3". To apply the same voltage in this manner is also referred to as "re-application".

In this case, the chip 100 according to the comparative example applies the voltage "Vera3" to the well interconnect CPWELL excessively by the period "Terad1_3". In other words, in the case of the chip 100 according to the comparative example, a voltage is excessively applied to the memory cell transistors MT, etc. By the repetition of such re-application, it is possible that the degradation of memory cell transistors is accelerated.

However, according to the above-described embodiment, even if the period "dT1" has passed while the chip 100 is applying the voltage "Vera3" to the well interconnect CPWELL, the chip 100 applies the voltage "Vera3" to the last. As a result, it becomes unnecessary for the chip 100 to re-apply the voltage "Vera3" to the well interconnect CPWELL.

It is thus possible to suppress degradation of memory cell transistors MT, and, as a result, to secure the number of times of write/erase in the chip 100.

In order to explain the advantageous effects of the above-described embodiment, the differences between a planar NAND flash memory and the chip 100 of the above-described embodiment will be described.

Figure 12A:
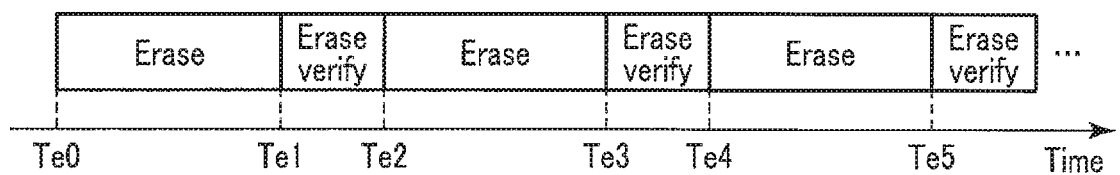
FIG. 12A is a view relating to the concrete example of the data erase operation according to the comparative example of the first embodiment.

As illustrated in FIG. 12A, in the planar NAND flash memory, the "Erase" operation time and "Erase verify" operation time are fixed. Thus, a controller, which controls the planar NAND flash memory, can suspend the "Erase" operation so that a re-application operation may not occur. For example, if the controller, which controls the planar NAND flash memory, suspends the "Erase" operation at timings of time instants Te1 to Te5 in FIG. 12A, the re-application operation does not occur.

On the other hand, in the chip 100 according to the above-described embodiment, the "Erase" operation time and "Erase verify" operation time are fixed. For example, the above-described chip 100 executes the "Erase" operation for the block, and then executes the "Erase verify" operation for each of the string units SU.

Figure 12B:
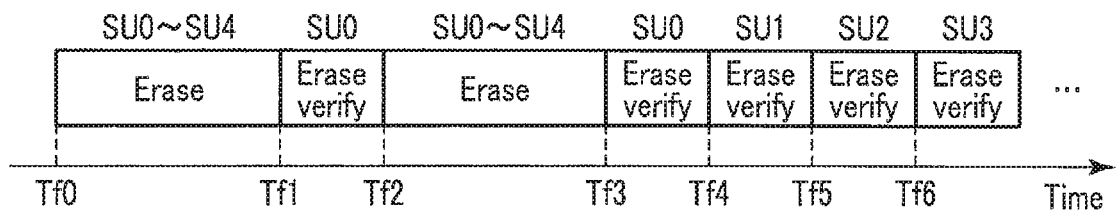
FIG. 12B and FIG. 12C are views relating to the concrete example of the data erase operation according to the first embodiment.
Figure 12C:
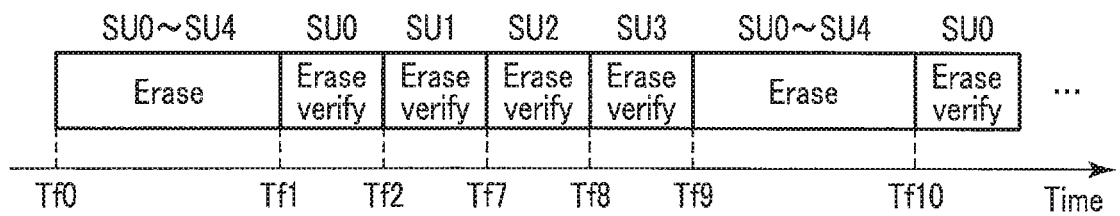

Referring to FIG. 12B and FIG. 12C, concrete cases will be described. Here, a description is given of a case in which the "Erase" operation is executed batchwise for four string units (SU0 to SU3), and the "Erase verify" operation is executed successively for the four string units (SU0 to SU3).

As illustrated in FIG. 12B, at a time point when the chip 100 has determined that the result of the "Erase verify" operation for the string unit SU0 is "fail", the chip 100 executes the "Erase" operation. Then, the chip 100 executes the "Erase verify" operation successively for the four string units (SU0 to SU3), and all string units (SU0 to SU3) become "pass". In this case, if the "Erase" operation is suspended at timings of time instants Tf1 to Tf6 in FIG. 12B, the re-application operation does not occur.

On the other hand, as illustrated in FIG. 12C, at a time point when the chip 100 has determined that the result of the "Erase verify" operation for the string unit SU3 is 'fail', the chip 100 executes the "Erase" operation. In this case, if the data erase operation is suspended at timings of time instants Tf1, Tf2, and Tf7 to Tf10 in FIG. 12C, the re-application operation does not occur.

As described above, the execution timing of the "Erase" operation and "Erase verify" operation varies depending on the result of the "Erase verify" operation in the four string units (SU0 to SU3). Thus, the controller 20 according to the above-described embodiment cannot determine at which timing the "Erase" operation should be suspended so that the re-application operation may not occur.

Thus, as in the above-described embodiment, by suspending the "Erase" operation in units of a predetermined time and by executing the voltage application operation during a preset time so that no re-application operation occurs, the re-application operation can be suppressed.

<1-4> Modification

A modification of the first embodiment is described. As illustrated in FIG. 8, in the first embodiment, each time the controller 20 resumes the "Auto Suspend erase" operation, the controller 20 inputs the "Auto Suspend erase" command set to the chip 100.

However, a command "z0h" for resume may be incorporated in the read command set. For example, as illustrated in FIG. 13, upon receiving the command "z0h", the sequencer 120 resumes the "Auto Suspend erase" operation after the completion of the read operation, without receiving the "Auto Suspend erase" command.

Here, the case was described in which the command "z0h" for resume is incorporated in the read command set. However, the restriction to this is unnecessary. The command "z0h" for resume can be incorporated in various command sets (e.g. write command set).

<2> Second Embodiment

A second embodiment is described. In the second embodiment, a description is given of a method of suspending the "Erase" operation within a predetermined time. Incidentally, the basic configuration and basic operation of a storage device according to the second embodiment are the same as those of the storage device according to the above-described first embodiment. Thus, the descriptions of the matters described in the first embodiment and matters which can be guessed from the first embodiment are omitted.

<2-1> Outline

In the present embodiment, the chip 100 suspends the "Erase" operation, based on a designated timing. In this embodiment, a suspend point table, which designates the timing of suspend, is stored in the register 104.

<2-2> Data Erase Operation

<2-2-1> Suspend Point Table

Referring to FIG. 14, an example of the suspend point table, which is stored in the register 104, is described. A suspend point table illustrated in FIG. 14 indicates a relationship between a suspend point SP, OEC, OPC, and EVFY. The suspend point SP specifies a timing of suspending the "Erase" operation. At the time of the data erase operation, the chip 100 suspends the data erase operation in the order beginning with a suspend point SP1. The EVFY is a flag value which determines whether or not to execute the "Erase verify" operation. For example, if EVFY is "0", the "Erase verify" operation is not executed. If EVFY is "1", the "Erase verify" operation is executed.

In the suspend point table illustrated in FIG. 14, a condition, which is necessary for restoring the chip 100 to the "ready" state within a predetermined period "dT2", is stored. Specifically, the period between respective suspend points SP is shorter than the predetermined period "dT2".

<2-2-2> Erase Waveform

Figure 15:
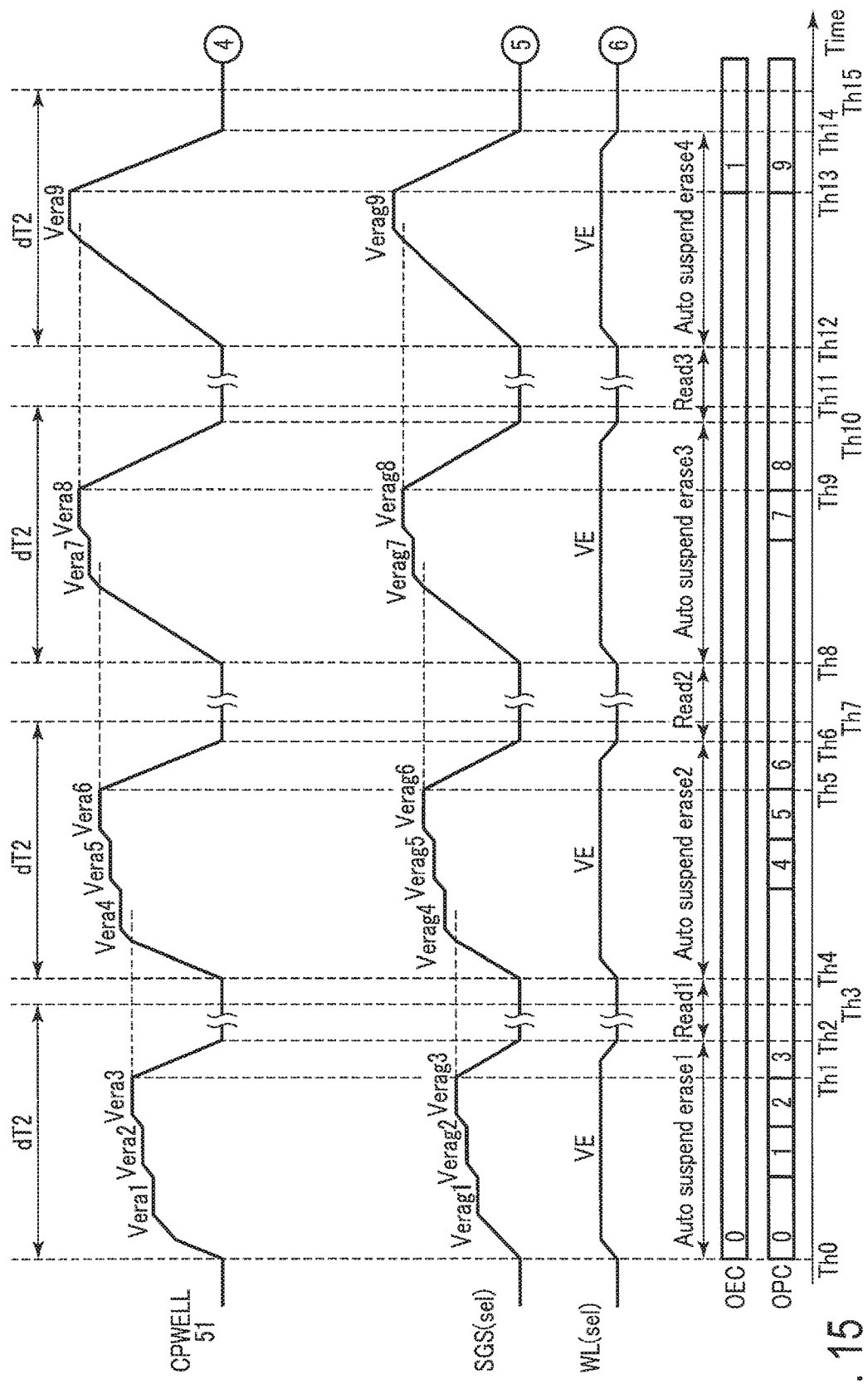
FIG. 15 is a waveform diagram relating to a concrete example of a data erase operation according to the second embodiment.
Figure 16:
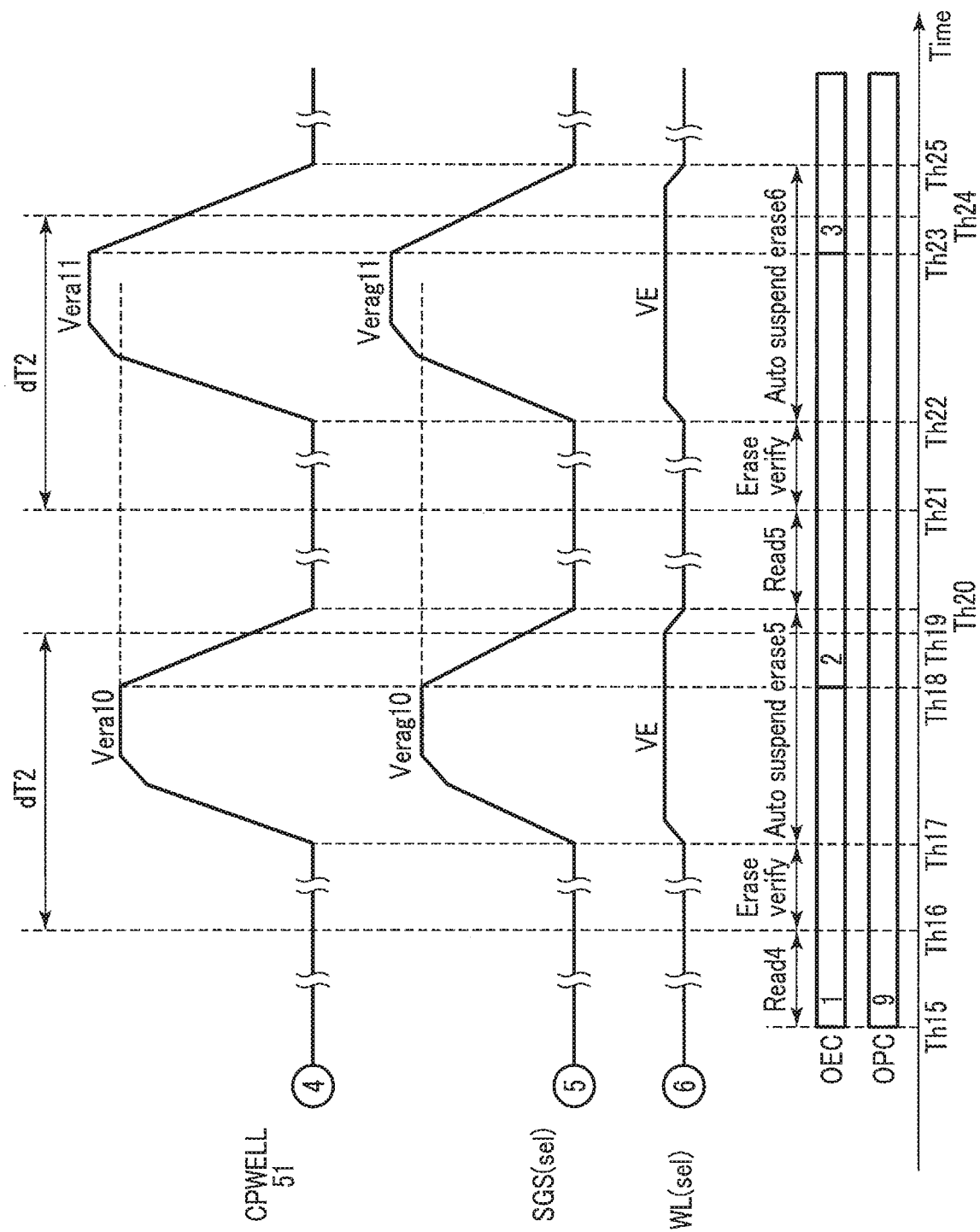
FIG. 16 is a waveform diagram relating to the concrete example of the data erase operation according to the second embodiment.

Referring to FIG. 14, FIG. 15 and FIG. 16, a concrete example of the suspend method of the data erase operation is described. As illustrated in FIG. 14, at the time of the data erase operation, the sequencer 120 suspends the data erase operation at suspend point SP1.

Specifically, the sequencer 120 first reads out information relating to the suspend point SP1 of the suspend point table. As the information relating to the suspend point SP1, the sequencer 120 acquires such information that the OEC is "0", OPC is "3", and EVFY is "0". This information means that the "Erase verify" operation is not executed, and the data erase operation is suspended if the OEC is "0" and OPC is "3". As illustrated in FIG. 15, the sequencer 120 suspends the data erase operation, based on the acquired information relating to the suspend point SP1. Thereby, as illustrated in FIG. 15, the "Auto Suspend erase 1" operation terminates before the period "dT2" has passed since time instant "Th0" at which the "Auto Suspend erase 1" operation begins.

When the sequencer 120 resumes the data erase operation, the sequencer 120 reads out information relating to a suspend point SP2 of the suspend point table. As illustrated in FIG. 15, the sequencer 120 suspends the data erase operation, based on the acquired information relating to the suspend point SP2. Thereby, as illustrated in FIG. 15, the "Auto Suspend erase 2" operation terminates before the period "dT2" has passed since time instant "Th4" at which the "Auto Suspend erase 2" operation begins.

When the sequencer 120 resumes the data erase operation, the sequencer 120 reads out information relating to a suspend point SP3 of the suspend point table. As illustrated in FIG. 15, the sequencer 120 suspends the data erase operation, based on the acquired information relating to the suspend point SP3. Thereby, as illustrated in FIG. 15, the "Auto Suspend erase 3" operation terminates before the period "dT2" has passed since time instant "Th8" at which the "Auto Suspend erase 3" operation begins.

When the sequencer 120 resumes the data erase operation, the sequencer 120 reads out information relating to a suspend point SP4 of the suspend point table. As illustrated in FIG. 15, the sequencer 120 suspends the data erase operation, based on the acquired information relating to the suspend point SP4. Thereby, as illustrated in FIG. 15, the "Auto Suspend erase 4" operation terminates before the period "dT2" has passed since time instant "Th12" at which the "Auto Suspend erase 4" operation begins.

When the sequencer 120 resumes the data erase operation, the sequencer 120 reads out information relating to a suspend point SP5 of the suspend point table. As illustrated in FIG. 16, the sequencer 120 suspends the data erase operation, based on the acquired information relating to the suspend point SP5. Thereby, as illustrated in FIG. 16, the "Auto Suspend erase 5" operation terminates before the period "dT2" has passed since time instant "Th16" at which the "Auto Suspend erase 5" operation begins.

When the sequencer 120 resumes the data erase operation, the sequencer 120 reads out information relating to a suspend point SP6 of the suspend point table. As illustrated in FIG. 16, the sequencer 120 suspends the data erase operation, based on the acquired information relating to the suspend point SP6. Thereby, as illustrated in FIG. 16, the "Auto Suspend erase 6" operation terminates before the period "dT2" has passed since time instant "Th21" at which the "Auto Suspend erase 6" operation begins.

As described above, each time the sequencer 120 resumes the data erase operation, the sequencer 120 suspends the data erase operation while advancing up the suspend point SP based on the suspend point table.

In the meantime, the suspend point table may be stored in the memory cell array 110, or may be supplied from the outside. In this embodiment, although an example of the suspend point table was described, the kind of suspend point table is not limited to this example. For example, a suspend point table is prepared for each of predetermined times. Besides, different suspend point tables may be stored for individual chips 100. When different suspend point tables may be stored for individual chips 100, the time needed for the "Auto Suspend erase" operation varies from chip 100 to chip 100.

<2-3> Advantageous Effects

According to the above-described embodiment, by suspending the data erase operation by using the suspend point table, it becomes possible to suppress re-applying the erase voltage. Thus, the same advantageous effects as in the first embodiment can be obtained.

Incidentally, the modification of the first embodiment can be combined with the second embodiment.

<2-4> Modification

A modification of the second embodiment is described. In the second embodiment, the case in which the register 104 stores the suspend point table was described. In the modification of the second embodiment, a case is described in which a suspend point is designated to the chip 100(0_0) from the outside of the chip 100(0_0).

<2-5> Command Sequence

Figure 17:
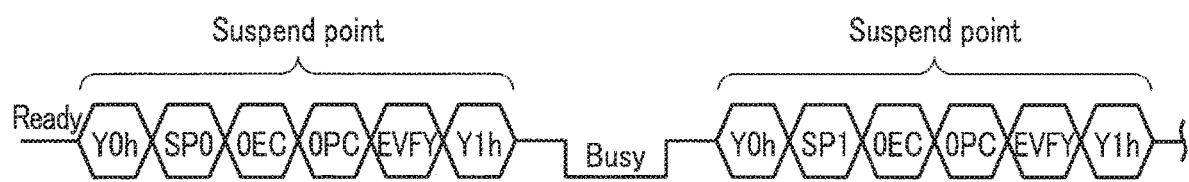
FIG. 17 is a command sequence relating to a concrete example of a data erase operation according to a modification of the second embodiment.

Referring to FIG. 17, a command sequence according to the modification of the second embodiment is described.

The bank controller 242(0_0) (hereinafter referred to simply as "bank controller 242" for the purpose of simple description) outputs an "Auto Suspend point" command set, which is stored in the queue 243(0_0) (hereinafter referred to simply as "queue 243" for the purpose of simple description), to the chip 100.

Figure 18:
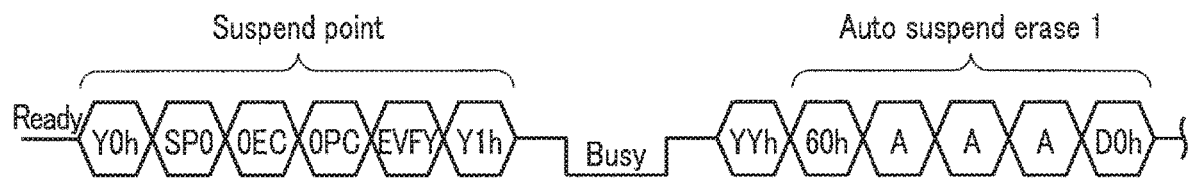
FIG. 18 is a command sequence relating to the concrete example of the data erase operation according to the modification of the second embodiment.

As illustrated in FIG. 18, the chip 100(0_0) (hereinafter referred to simply as "chip 100" for the purpose of simple description) receives a "Y0h" command as the "Auto Suspend point" command set, and thereafter receives suspend point information by four cycles. Specifically, the chip 100 receives, as the suspend point information, a suspend point SPi (i is an integer), and OEC, OPC and EVFY corresponding to the suspend point SPi. Then, if a "Y1h" command is input, the chip 100 enters the "busy state", and the suspend point information is stored in the register 104.

The bank controller 242 can successively input a plurality of "Auto Suspend point" command sets.

In addition, as illustrated in FIG. 18, after the "Auto Suspend point" command set is input, an "Auto Suspend erase" command set may be input subsequently.

By storing a plurality of pieces of suspend point information in the register 104, the sequencer 120 may use the suspend point information as the suspend point table as in the second embodiment. In this case, the bank controller 242 does not need to transmit the suspend point information.

In addition, the bank controller 242 may be configured to input the "Auto Suspend point" command set without fail, before inputting the "Auto Suspend erase" command set.

Incidentally, the modification of the first embodiment can be combined with the modification of the second embodiment.

<3> Third Embodiment

A third embodiment is described. In the third embodiment, a description is given of a method of switching a suspend method of a data erase operation, in accordance with the degree of priority of a command. Incidentally, the basic configuration and basic operation of a storage device according to the third embodiment are the same as those of the storage devices according to the above-described first and second embodiments. Thus, the descriptions of the matters described in the first and second embodiments and matters which can be guessed from the first and second embodiments are omitted.

<3-1> Configuration of Storage Device

The configuration of the storage device including a memory system according to the present embodiment is described with reference to FIG. 19.

As illustrated in FIG. 19, the bank controller 242 of the storage device 1 includes a first queue 245 and a second queue 246. The first queue 245 and second queue 246 are FIFO circuits. For example, a command set, which has a higher degree of priority than a command set that is input to the second queue 246, is input to the first queue 245. The bank controller 242 supplies earlier the command set, which was input to the first queue 245, to the bank arbiter 244, than the command set which was input to the second queue 246.

In other words, when an instruction with high priority was delivered from the host 3, the instruction with high priority is set in the first queue 245. In addition, when an instruction with low priority was delivered from the host 3, the instruction with low priority is set in the second queue 246.

<3-2> Outline of Data Erase Operation

In the first embodiment, the "Auto Suspend Erase" operation does not terminate until the preset period has passed. However, depending on instructions from the host 3, there is a case in which it is desirable to immediately terminate the "Auto Suspend Erase" operation.

When an instruction with high priority was input from the host 3, the storage device 1 according to this embodiment immediately terminates the "Auto Suspend Erase" operation. On the other hand, when an instruction with low priority was input from the host 3, the storage device 1 according to this embodiment does not immediately terminate the "Auto Suspend Erase" operation.

<3-3> Concrete Example of Data Erase Operation

Hereinafter, a concrete example of the data erase operation according to this embodiment is described. In the description below, an "Auto Suspend erase" operation, which is executed mainly by the chip 100(0_0), is described by way of example.

Figure 20:
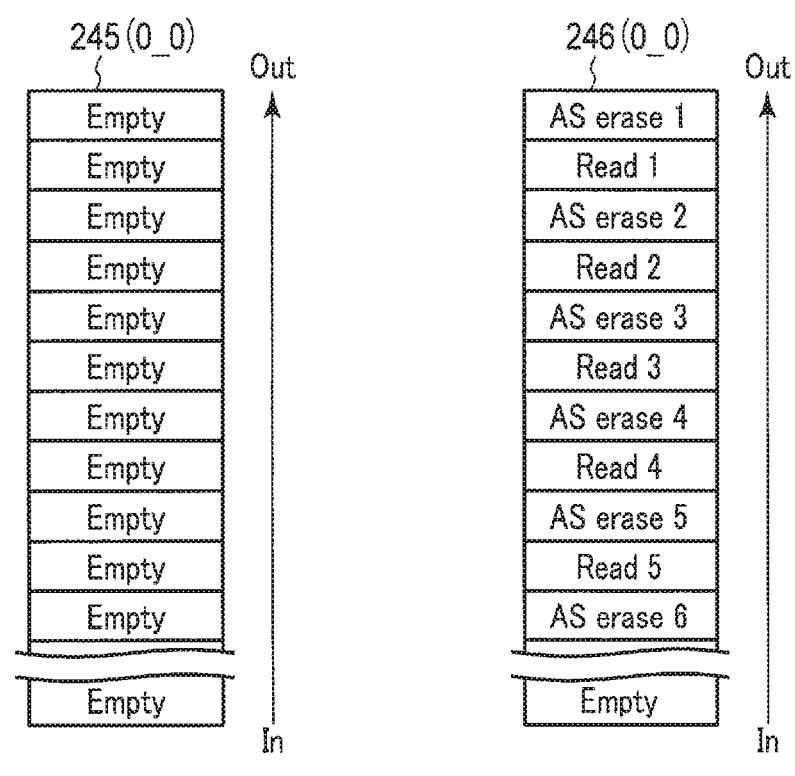
FIG. 20 is a diagram of a queue according to the third embodiment.

As illustrated in FIG. 20, no command set is input to the first queue 245(0_0), and command sets are input to the second queue 246(0_0).

The bank controller 242(0_0) (hereinafter referred to simply as "bank controller 242" for the purpose of simple description) outputs an "Auto Suspend erase 1" command set, which is stored at the beginning of the second queue 246(0_0) (hereinafter referred to simply as "second queue 246" for the purpose of simple description), to the chip 100(0_0) (hereinafter referred to simply as "chip 100" for the purpose of simple description).

Figure 21:
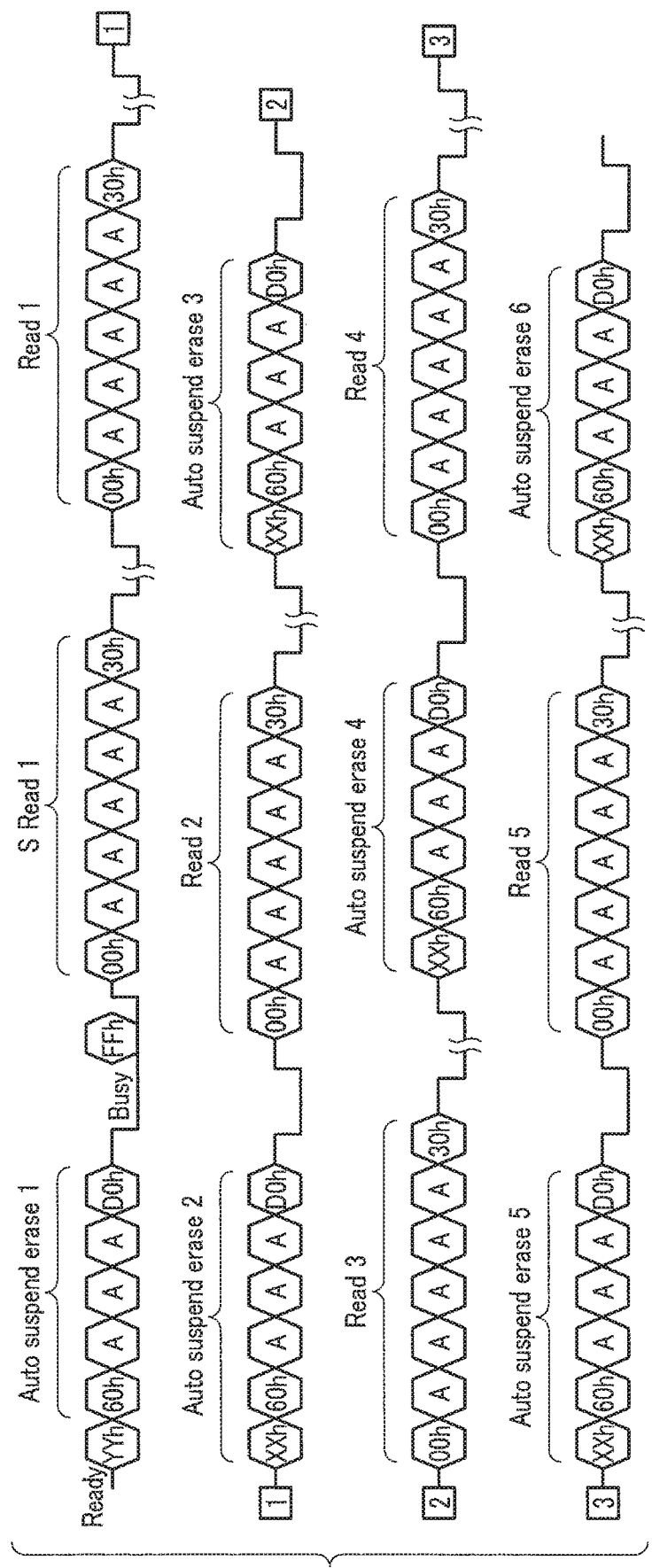
FIG. 21 is a command sequence relating to a concrete example of a data erase operation according to the third embodiment.

As illustrated in FIG. 21, the chip 100 successively receives a "YYh" command and a "60h" command as the "Auto Suspend erase 1" command set, and thereafter receives row addresses of three cycles.

Then, if a "D0h" command is input, the chip 100 executes an "Auto Suspend erase 1" operation, and enters the "busy" state.

Figure 22:
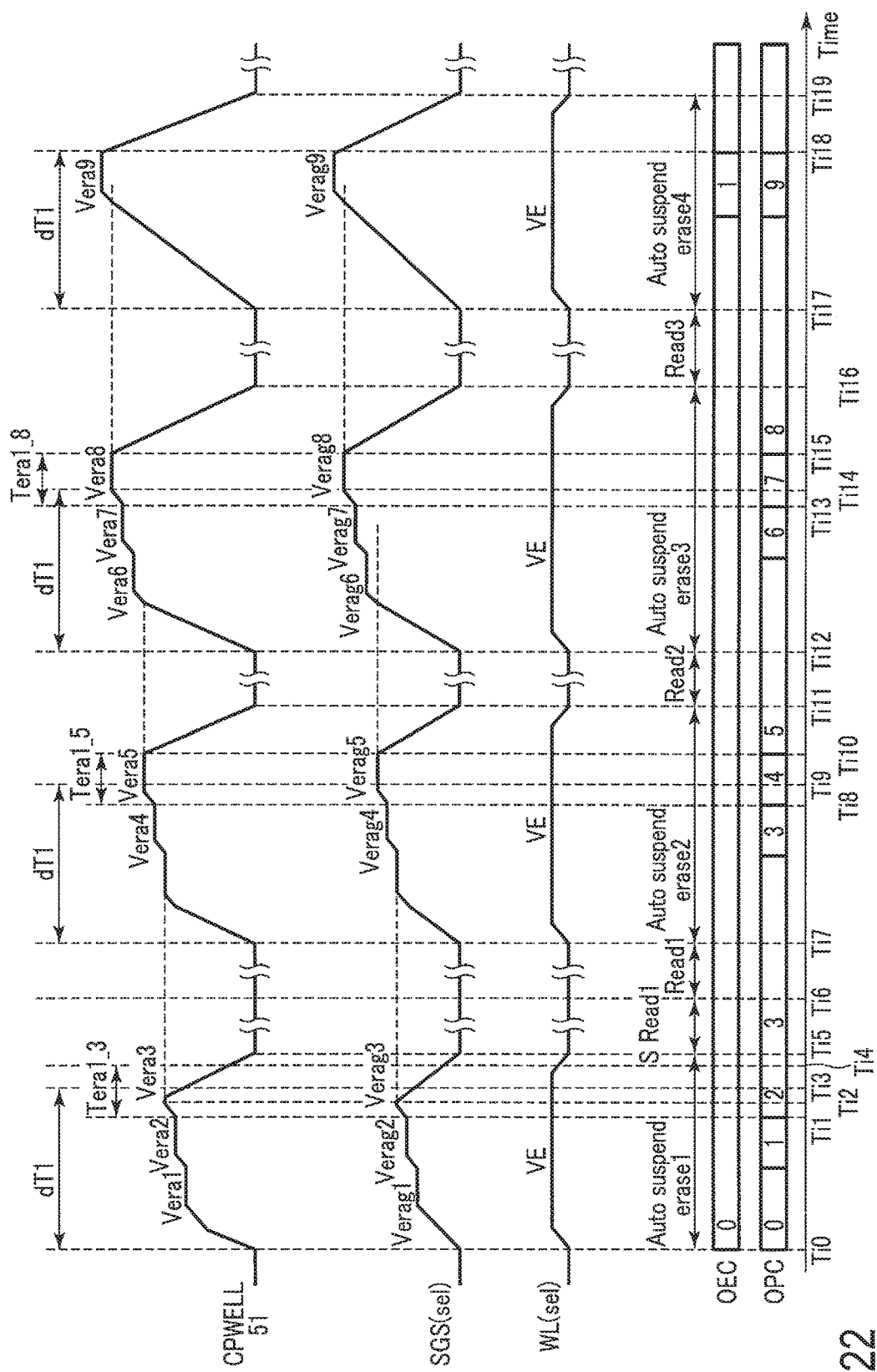
FIG. 22 is a waveform diagram relating to the concrete example of the data erase operation according to the third embodiment.

Upon receiving the "D0h" command, the sequencer 120 of the chip 100 executes the "Auto Suspend erase 1" operation during a period "dT1" from "Ti0" in FIG. 22.

Figure 23:
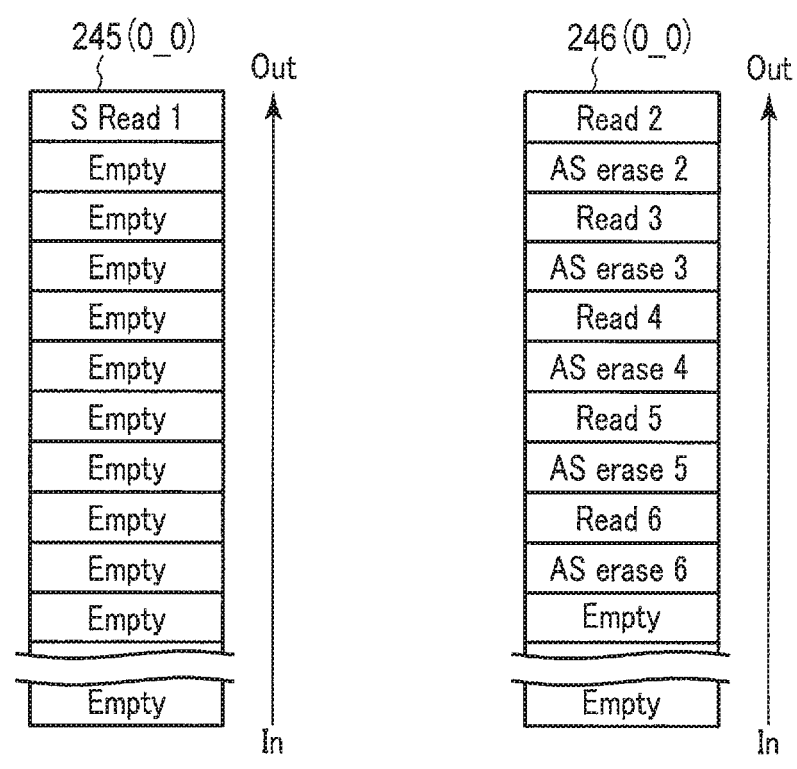
FIG. 23 is a diagram of a queue according to the third embodiment.

As illustrated in FIG. 23, while the chip 100 is executing the "Auto Suspend erase 1" operation, a "READ" command (described as "S READ") is input to the first queue 245(0_0) (hereinafter referred to simply as "first queue 245" for the purpose of simple description).

The bank controller 242 outputs an "S READ 1" command set, which is stored at the beginning of the first queue 245, to the chip 100.

As illustrated in FIG. 21, the chip 100 receives an "FFh" command as the "S READ 1" command set. Upon receiving the "FFh" command, the chip 100 immediately stops the operation which is currently executed ("Auto Suspend erase 1" operation).

Thereby, as illustrated in FIG. 22, the sequencer 120 immediately suspends the applying voltage "Verax" to the well interconnect CPWELL.

The chip 100 is configured to apply voltage "Vera3" to the well interconnect CPWELL during a predetermined period "Tera1_3". However, in this embodiment, the chip 100 does not apply voltage "Vera3" to the well interconnect CPWELL during the predetermined period "Tera1_3". Thus, when the chip 100 executes an "Auto Suspend erase 2", the chip 100 re-applies the voltage "Vera3" to the well interconnect CPWELL during the predetermined period "Tera1_3".

Thereby, the "Auto Suspend erase 1" operation ends. In this embodiment, the "Auto Suspend erase 1" operation corresponds to an operation up to a certain point during the above-described "Erase 1".

As illustrated in FIG. 21, the chip 100 receives a "00h" command of the "S READ 1" command set, and thereafter receives column addresses and row addresses by five cycles. Then, upon receiving "30h", the chip 100 enters the "busy state", and executes an "S READ 1" operation.

Upon receiving the "30h" command, the sequencer 120 of the chip 100 executes the "S READ 1" operation during a period from time instant "Ti5" to time instant "Ti6" in FIG. 22. Then, if the "S READ 1" operation ends, the chip 100 enters the "ready state".

If the chip 100 enters the "ready state" and no command set is input to the first queue 245, the bank controller 242 supplies a "READ 1" command set of the second queue 246 to the chip 100.

As illustrated in FIG. 21, the chip 100 receives a "00h" command of the "READ 1" command set, and thereafter receives column addresses and row addresses by five cycles. Then, upon receiving "30h", the chip 100 enters the "busy state", and executes a "READ 1" operation.

Upon receiving the "30h" command, the sequencer 120 of the chip 100 executes the "READ 1" operation during a period from time instant "Ti6" to time instant "Ti7" in FIG. 22. Then, if the "READ 1" operation ends, the chip 100 enters the "ready state".

If the chip 100 enters the "ready state" and no command set is input to the first queue 245, the bank controller 242 supplies an "Auto Suspend erase 2" command set of the second queue 246 to the chip 100. Unless a command set is input to the first queue 245, the chip 100 executes the same operation as described in the first embodiment.

<3-4> Advantageous Effects

According to the above-described embodiment, based on the degree of priority of commands, the "Auto Suspend erase" operation is immediately suspended, or is not immediately suspended.

Thereby, it is possible to suppress degradation of the memory cell transistors MT, and to suppress a decrease in processing speed by immediately suspending the "Auto Suspend erase" operation.

Incidentally, the modification of the first embodiment can be combined with the third embodiment.

<3-5> Modification of the Third Embodiment

A modification of the third embodiment is described.

<3-5-1> Outline

In the present modification, an "FFh" command and an "XYh" command are prepared as suspend commands. As described in the third embodiment, the controller 20 issues the "FFh" command to the chip 100, when the controller 20 has received an instruction with high priority from the host 3. Upon receiving the "FFh" command, the chip 100 immediately stops the "Erase" operation which is currently executed. The controller 20 issues the "XYh" command to the chip 100, when the controller 20 has received an instruction with low priority from the host 3. Upon receiving the "XYh" command, the chip 100 executes the "Erase" operation until a time point at which re-application does not occur, and then suspends the "Erase" operation.

In the present modification, a description is given of a case in which these two kinds of suspend commands are selectively used in accordance with instructions from the host 3.

<3-5-2> Concrete Example

Hereinafter, a concrete example of the data erase operation according to this modification is described.

As illustrated in FIG. 24, the chip 100 receives a "60h" command as the "Erase 1" command set, and thereafter receives row addresses of three cycles.

If a "D0h" command is input, the chip 100 executes an "Erase 1" operation and enters the "busy state".

Figure 25:
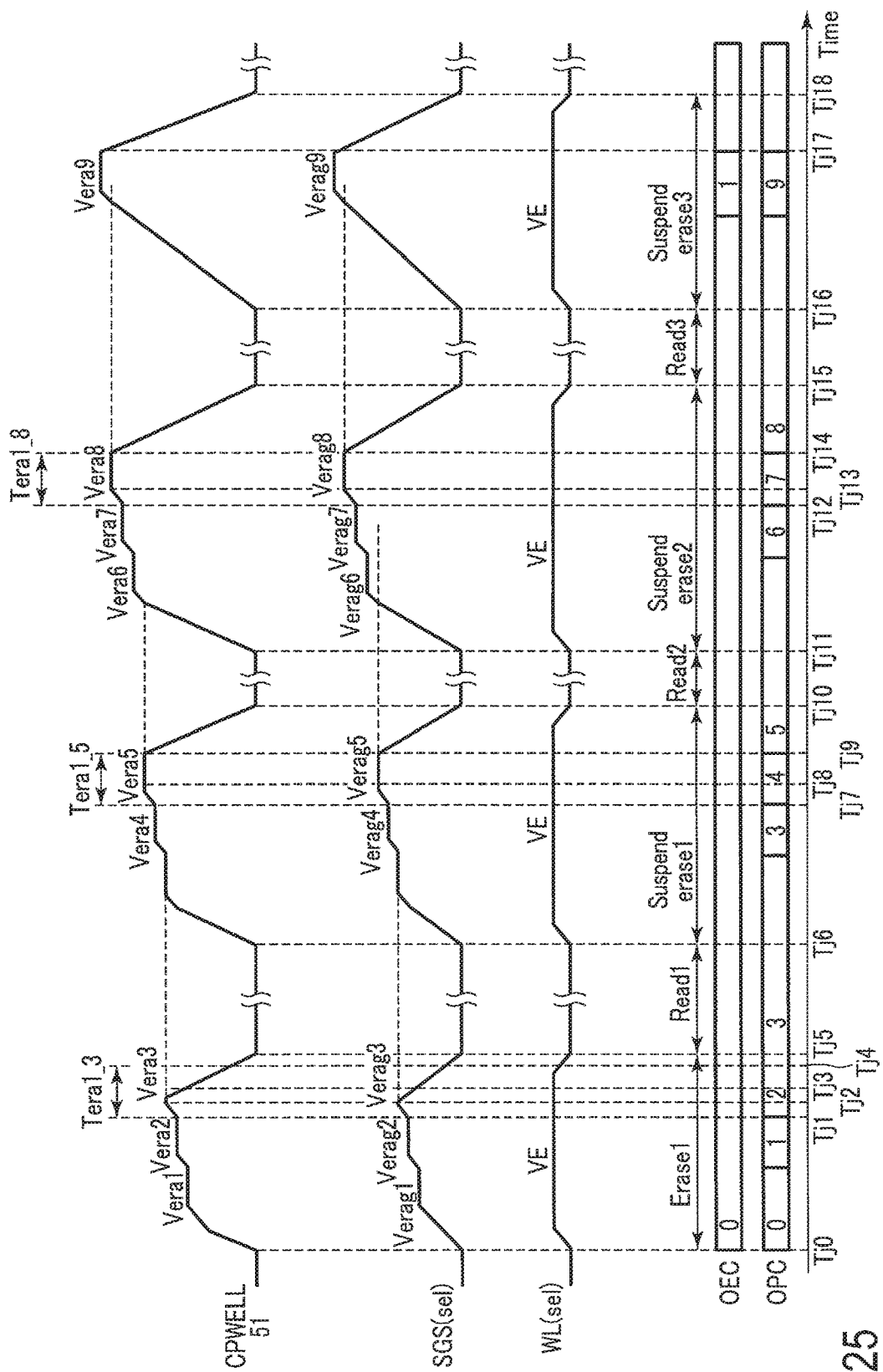
FIG. 25 is a diagram of a queue according to the modification of the third embodiment.

Upon receiving the "D0h" command, the sequencer 120 of the chip 100 executes the "Erase 1" from time instant "Tj0" in FIG. 25.

There is a case in which a request relating to an instruction with high priority (e.g. "READ") is issued from the host 3 to the controller 20 while the "Erase 1" operation is being executed. In this case, as illustrated in FIG. 24, while the chip 100 is executing the "Erase 1" operation (e.g. during a period from time instant Tj1 to time instant Tj2 in FIG. 25), the controller 20 issues an "FFh" command.

As illustrated in FIG. 25, upon receiving the "FFh" command, the chip 100 immediately suspends the "Erase 1" operation.

Then, the controller 20 outputs a "READ" command set to the chip 100. As illustrated in FIG. 24, the chip 100 receives a "00h" command of the "READ 1" command set, and thereafter receives column addresses and row addresses by five cycles. Then, upon receiving "30h", the chip 100 enters the "busy state", and executes a "READ 1" operation. If the chip 100 terminates the "READ 1" operation, the chip 100 enters the "ready state".

If the chip 100 enters the "ready state" and a request relating to an instruction other than the data erase operation is not issued from the host 3 to the controller 20, the controller 20 executes the continuation of the "Erase 1" operation for the chip 100. In the present modification, the data erase operation following the "Erase 1" operation is referred to as "suspend erase (Suspend erase) operation".

As illustrated in FIG. 25, in the "Erase 1" operation, the chip 100 does not apply voltage "Vera3" to the well interconnect CPWELL during a predetermined period "Tera1_3".

Thus, in the "Suspend erase 1" operation following the "Erase 1" operation, the chip 100 resumes the "Erase" operation from the application operation of voltage "Vera3" to the well interconnect CPWELL.

There is a case in which, while the "Suspend erase 1" operation is being executed, a request relating to an instruction with low priority (e.g. "READ") is issued from the host 3 to the controller 20. In this case, as illustrated in FIG. 24, the controller 20 issues the "XYh" command while the chip 100 is executing the "Suspend erase 1" operation (e.g. during a period from time instant Tj7 to time instant Tj8 in FIG. 25).

As illustrated in FIG. 25, upon receiving the "XYh" command, the chip 100 executes the "Suspend erase 1" operation until time instant Tj9 at which no re-application occurs, and then suspends the "Suspend erase 1" operation. The chip 100 increments the OPC by executing the "Suspend erase 1" operation until time instant Tj9.

In addition, the controller 20 outputs a "READ" command set to the chip 100. As illustrated in FIG. 24, the chip 100 receives a "00h" command of the "READ 2" command set, and thereafter receives column addresses and row addresses by five cycles. Then, upon receiving "30h", the chip 100 enters the "busy state", and executes a "READ 2" operation. Then, if the chip 100 terminates the "READ 2" operation, the chip 100 enters the "ready state".

If the chip 100 enters the "ready state" and a request relating to an instruction other than the data erase operation is not issued from the host 3 to the controller 20, the controller 20 executes the continuation of the "Suspend erase 1" operation for the chip 100.

As illustrated in FIG. 25, in the "Suspend erase 1" operation, the chip 100 applies voltage "Vera5" to the well interconnect CPWELL during a predetermined period "Tera1_5".

Thus, in the "Suspend erase 2" operation following the "Suspend erase 1" operation, the chip 100 resumes the "Erase" operation from the application operation of voltage "Vera6 (Vera6>Vera 5)" to the well interconnect CPWELL.

<3-5-3> Advantageous Effects

As described above, if the chip 100 receives the "FFh" command, the chip 100 can immediately suspend the "Erase" operation. However, it is possible that the "Erase" operation after the reception of the "FFh" command becomes a re-application operation. On the other hand, if the chip 100 receives the "XYh" command, the chip 100 executes the "Erase" operation until the OPC is incremented. Thus, compared to the case of the reception of the "FFh" command, a longer time is needed until suspend, but no re-application operation occurs.

Thereby, the same advantageous effects as in the third embodiment can be obtained. Besides, the present modification may be combined with the above-described embodiments.

<4> Fourth Embodiment

A fourth embodiment is described. In the fourth embodiment, a description is given of a case in which a counter for counting the OPC is newly provided. Incidentally, the basic configuration and basic operation of a storage device according to the fourth embodiment are the same as those of the storage devices according to the above-described first to third embodiments. Thus, the descriptions of the matters described in the first to third embodiments and matters which can be guessed from the first to third embodiments are omitted.

<4-1> Outline of the Fourth Embodiment

As described with reference to FIG. 11, during the "Auto Suspend erase" operation, if the "Auto Suspend erase" operation is suspended before the completion of applying predetermined voltage "Verax" to the well interconnect CPWELL, a re-application operation occurs. The chip 100 determines, based on the value of OPC, whether the voltage "Verax" has been applied for a predetermined period. Specifically, unless the OPC is incremented, the re-application will be repeated.

Thus, in the present embodiment, a counter for counting the OPC is provided. This counter may be provided in the chip 100, or the sequencer 120 may function as the counter. The counter executes counting, for example, based on the data strobe signals DQS and BDQS which are received.

The counter starts counting if the application operation of voltage "Verax" is started. The counter executes counting from "0" to "m−1" (m is an integer) (see FIG. 26A, FIG. 26B, etc.). If the counter has counted up to "m−1", the sequencer 120 increments the OPC.

<4-2> Concrete Example

Here, a description is given of an operation example of the chip 100 according to the fourth embodiment, in the case in which the "Auto Suspend erase" operation is suspended before the completion of applying predetermined voltage "Verax".

Figure 26:
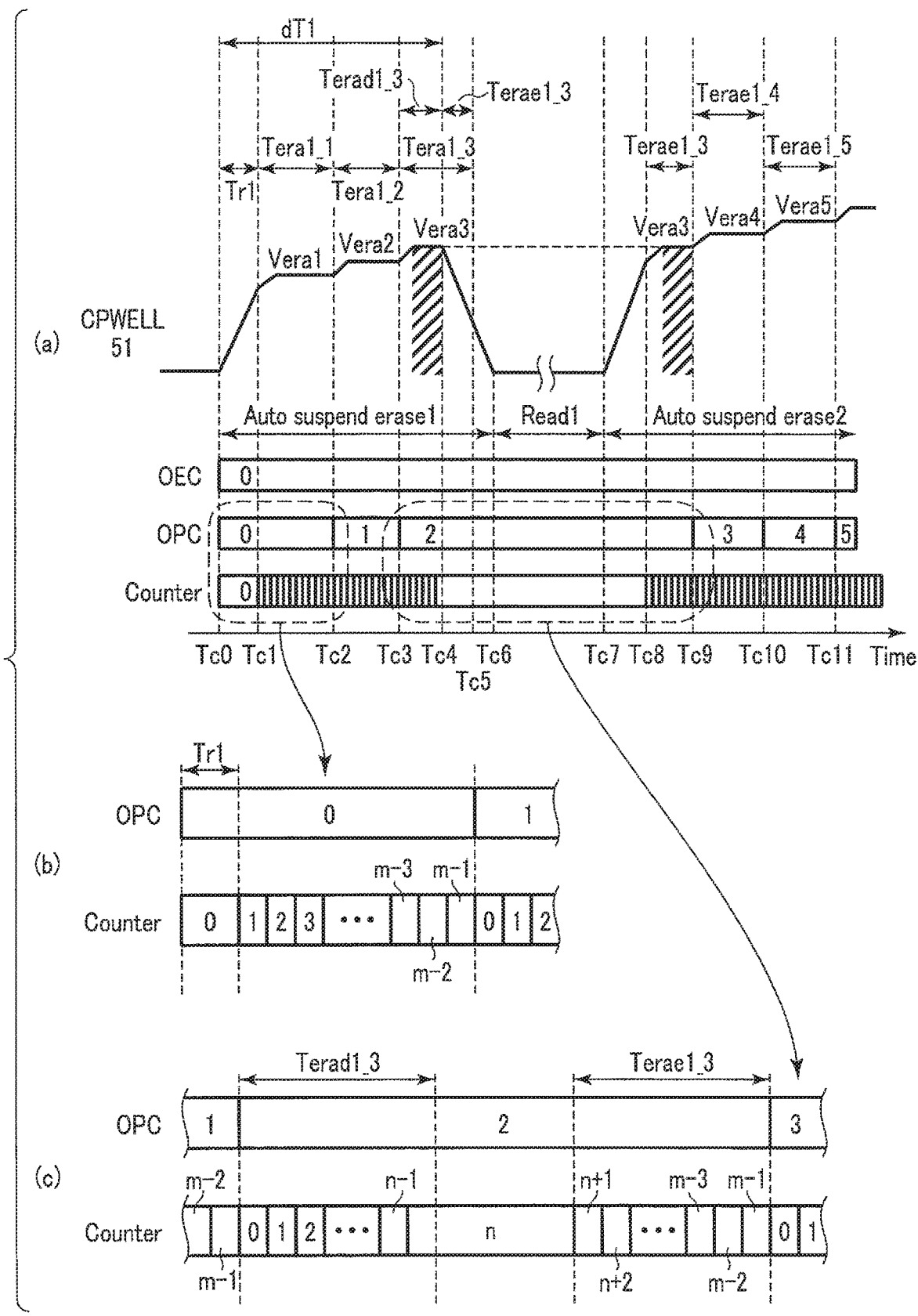
FIG. 26 is a waveform diagram relating to a concrete example of a data erase operation according to a fourth embodiment.

As illustrated in FIG. 26A, the "Auto Suspend erase" operation is suspended while the sequencer 120 is applying the voltage "Vera3" to the well interconnect CPWELL. The counter stops counting at a time point at which the applying the voltage "Vera3" has been stopped. As illustrated in FIG. 26C, in this embodiment, the counter stops counting at a timing of time instant Tc4 at which the applying voltage "Vera3" is stopped. In this embodiment, for example, the counting is stopped when the count value is "n" (n is an integer). It is assumed that the period between count values "0" and "n" is a period "Terad1_3". Then, the counter resumes counting, if the "Auto Suspend erase" operation is resumed and the sequencer 120 starts the application operation of voltage "Vera3" to the well interconnect CPWELL. Specifically, at time instant Tc8, the counter resumes counting from count value "n+1". Then, if the counter counts up to "m−1", the sequencer 120 increments the OPC. If the sequencer 120 increments the OPC, the sequencer 120 starts the application operation of voltage "Vera4" to the well interconnect CPWELL. For example, it is assumed that the period between count values "n+1" and "m−1" is a period "Terae1_3". Specifically, the sequencer 120 has applied the voltage "Vera3" to the well interconnect CPWELL during the "Tera1_3" (=period "Terad1_3"+period "Terae1_3").

In the meantime, in the present embodiment, the period needed for the application operation of voltage "Vera1" to "Vera9" is equal. Thus, when the "Auto Suspend erase" operation is resumed, the application period of voltage "VeraC (C is an integer)", which is first applied, is different from the application period of voltage "VeraC+1", which is applied subsequently. The reason for this is that, when the "Auto Suspend erase" operation was resumed, the continuation of the application operation of voltage "VeraC" in the immediately preceding operation is executed, and so the application operation of voltage "VeraC" becomes shorter.

In the example illustrated in FIG. 26A, the application period "Terae1_3" of voltage "Vera3" is shorter than the application period "Tera1_4" of voltage "Vera4". Similarly, the application period "Terae1_3" of voltage "Vera3" is shorter than the application period "Tera1_5" of voltage "Vera5". The application operation of voltage "Vera3" in the "Auto Suspend erase 2" operation is the execution of the continuation of the application operation of "Vera3" in the "Auto Suspend erase 1" operation. Thus, in the "Auto Suspend erase 2" operation, the period of the application operation of voltage "Vera3" becomes shorter than the application operation of other voltage "Vera".

<4-3> Advantageous Effects

According to the above-described embodiment, the chip 100 increments the OPC by counting from "0" to "m−1".

In the comparative example of FIG. 11, unless the OPC is incremented, the operation of applying voltage "Verax" is repeated during the predetermined period "Teray" or period "Teray_z". Specifically, when the voltage "Verax" is applied, if the application operation of voltage "Verax" is suspended before the period "Teray" or period "Teray_z" has passed, the re-application operation occurs.

However, according to the above-described embodiment, counting is executed by equally dividing the period "Teray" or period "Teray_z" by m. Thus, even if the application operation of voltage "Verax" is suspended halfway during the period "Teray" or period "Teray_z", the application operation of voltage "Verax" can be resumed from the halfway point of the period "Teray" or period "Teray_z". As a result, it is possible to suppress the re-application operation as in the comparative example described with reference to FIG. 11.

<5> Fifth Embodiment

A fifth embodiment is described. In the fifth embodiment, a description is given of a method of generating the suspend point table which was described in the second embodiment. Incidentally, the basic configuration and basic operation of a storage device according to the fifth embodiment are the same as those of the storage devices according to the above-described first to fourth embodiments. Thus, the descriptions of the matters described in the first to fourth embodiments and matters which can be guessed from the first to fourth embodiments are omitted.

<5-1> Outline

In this embodiment, a description is given of a case in which the controller 20 generates the suspend point table which was described in the second embodiment.

The suspend point table is generated, for example, at a time of a manufacturing test step prior to shipment of the storage device 1. For example, a user determines an acceptable maximum period "dTin" from when the chip 100 enters the "busy" state to when the chip 100 returns to the "ready" state during an erase operation. Then, if the controller 20 receives the period "dTin" from the user, the controller 20 extracts such a suspend point SP that the chip 100, which entered the "busy" state, returns to the "ready" state within the period "dTin". Specifically, such a table that the data erase operation can properly be suspended within the period "dTin" is generated. The user can generate suspend point tables for a plurality of kinds of periods "dTin". Hereinafter, a detailed generation method of the suspend point table is described.

<5-2> Suspend Candidate Point Table

Figure 27:
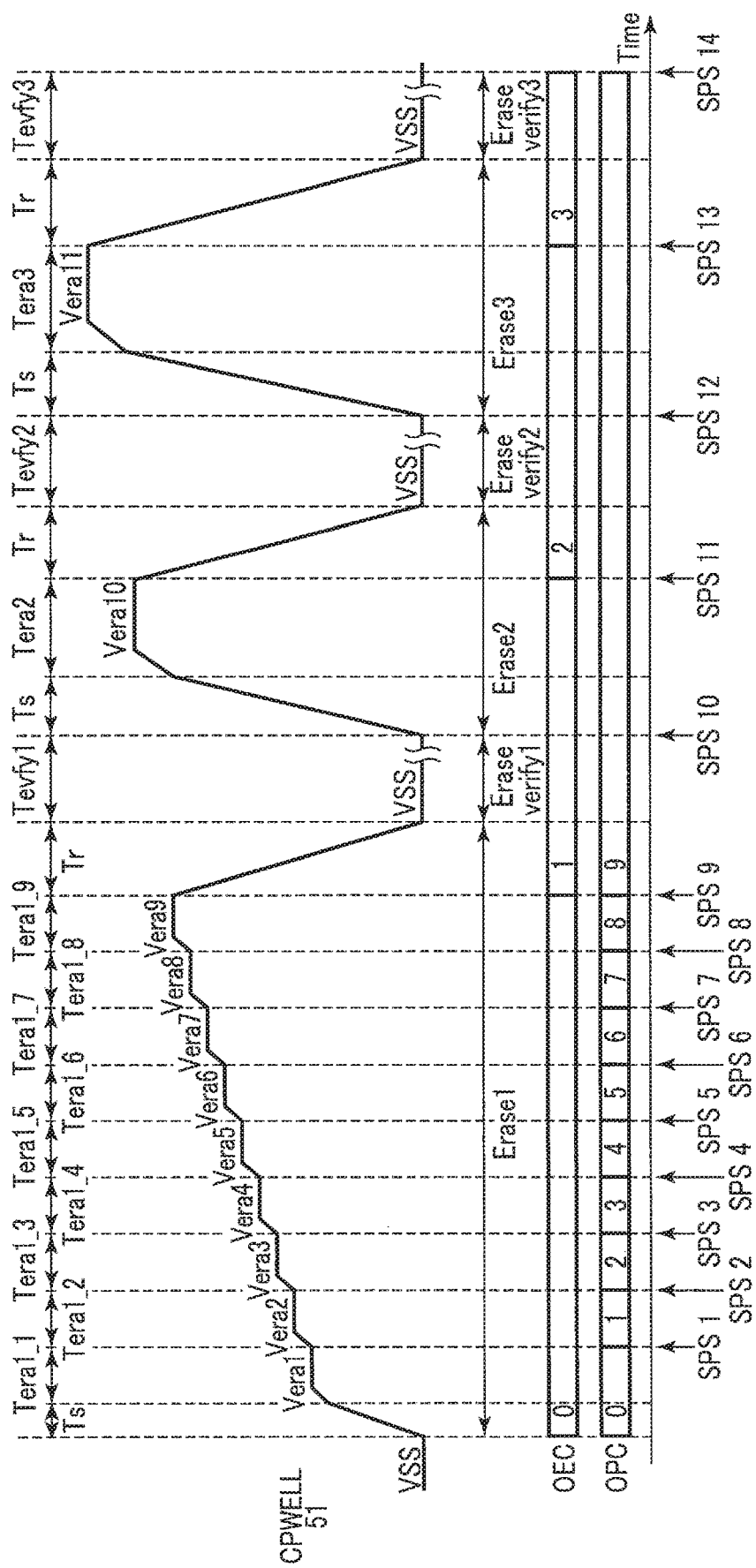
FIG. 27 is a waveform diagram of the data erase operation.

Referring to FIG. 27 and FIG. 28, a suspend candidate point table is described. The suspend point table is generated on the basis of the suspend candidate point table.

As illustrated in FIG. 27, in the data erase operation, there exist timings suited to suspend (suspend candidate points SPS).

For example, as illustrated in FIG. 27, the timing of the end of applying voltage "Vera" in the "Erase" operation and the timing of the end of the "Erase verify" operation are suited to suspend.

Here, periods are explained. As illustrated in FIG. 27, in the time of the "Erase" operation, a period, during which voltage "VSS" rises to about voltage "Verax", is defined as period "Ts". Further, in the time of the "Erase" operation, a period, during which a rise occurs to voltage "Verax" and the voltage "Verax" is maintained, is defined as "Tera y" (in erase 2, erase 3, . . . ) or "Teray_z" (in erase 1). In addition, in the time of the "Erase" operation, a period, during which voltage "Verax" falls to voltage "VSS", is defined as period "Tr". A period from the start to the end of the "Erase verify" operation is defined as "Tevfyw" (w is an integer)

As illustrated in FIG. 28, timings suited to suspend (suspend candidate points SPS) and conditions (OEC, OPC and EVFY) for realizing these timings are registered in a suspend candidate point table.

Specifically, in the suspend candidate point table, a suspend candidate point "SPS[e_index]", period "T[e_index]", OEC, OPC and EVFY are set in association with each "e_index (s_index)".

The e_index and s_index are integer variables which become indices of the suspend candidate point table. As will be described later, the e_index indicates a suspend candidate point at which the "Erase" operation is started, or a suspend candidate point at which the "Erase" operation is resumed. The s_index indicates a suspend candidate point for suspending the "Erase" operation.

A "Period T" described in the suspend candidate point table of FIG. 28 means an elapsed time from an immediately preceding suspend candidate point. In addition, in some cases, the controller 20 adds a period to "Period T" described in the suspend candidate point table of FIG. 28, by a condition described in parentheses. An "Internal operation" described in the suspend candidate point table of FIG. 28 means an operation state of the chip 100 at the suspend candidate point.

<5-3> Suspend Point Table Generation Flow

Figure 29:
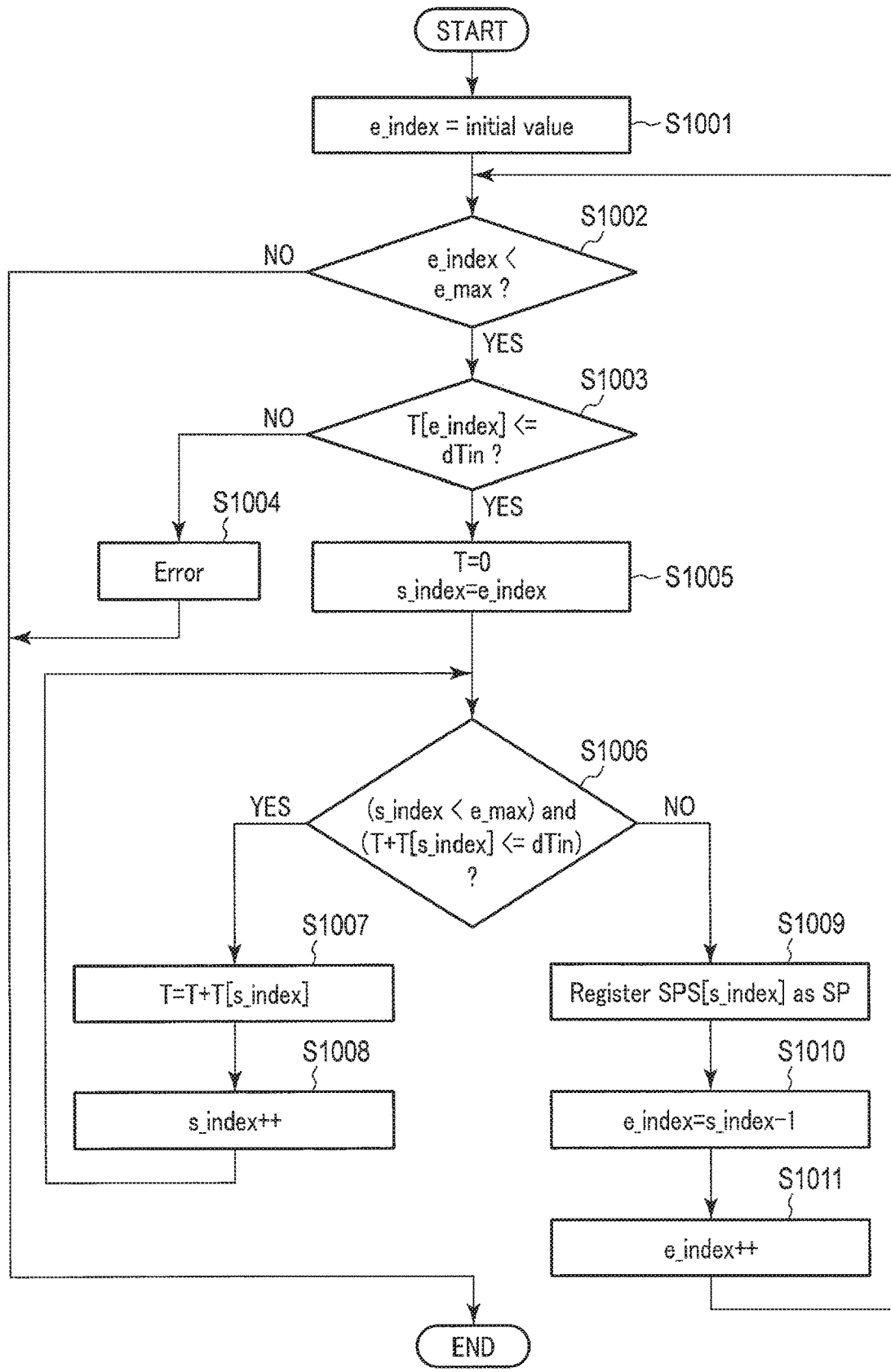
FIG. 29 is a flowchart for generating a suspend point table.

Referring to FIG. 28 and FIG. 29, a description is given of a basic generation method of the suspend point table described in the second embodiment.

[Step S1001]

The controller 20 initializes "e_index" with an initial value (in the case of FIG. 28, "1" is the initial value of e_index). Incidentally, in the case of FIG. 28, "0" does not become the initial value of e_index.

[Step S1002]

The controller 20 determines whether "e_index" is less than "e_max" (e.g. in the case of FIG. 28, "2t+9" becomes "e_max"). The "e_max" is a value obtained by adding "1" to the last "e_index" value of the suspend candidate point table. If the controller 20 determines that "e_index" is not less than "e_max" (step S1002, NO), the suspend point table generation operation ends.

[Step S1003]

If the controller 20 determines that "e_index" is less than "e_max" (step S1002, YES), the controller 20 determines whether period "T[e_index]" is equal to or less than period "dTin". The period "dTin" corresponds to the period "dT2" described in the second embodiment. The period "dTin" is input, for example, by the user.

[Step S1004]

If the controller 20 determines that period "T[e_index]" is greater than period "dTin" (step S1003, NO), the controller 20 determines the occurrence of an error, and terminates the suspend point table generation operation. For example, the controller 20 informs the user that, as regards period "dTin", a suspend table for suspending the "Erase" operation within the period "dTin" cannot be generated.

In the meantime, even in the case where the controller 20 determines that period "T[e_index]" is greater than period "dTin", it is possible to transition to step S1005 by simply issuing an alert to the user. In this case, however, the generated suspend point table is unable to satisfy the condition that the chip 100 returns to the "ready" state within the period "dTin".

[Step S1005]

If the controller 20 determines that period "T[e_index]" is equal to or less than period "dTin" (step S1003, YES), the controller 20 substitutes "0" for variable "T". Subsequently, the controller 20 substitutes "e_index" for "s_index".

[Step S1006]

The controller 20 determines whether "s_index" is less than "e_max", and time "T+T[s_index]" is equal to or less than period "dTin".

[Step S1007]

If the controller 20 determines that "s_index" is less than "e_max", and time "T+T[s_index]" is equal to or less than period "dTin" (step S1006, YES), the controller 20 substitutes time "T+T[s_index]" for variable "T".

[Step S1008]

The controller 20 increments "s_index". Then, the controller 20 executes the operation of step S1006.

[Step S1009]

If the controller 20 determines that "s_index" is not less than "e_max", or that time "T+T[s_index]" is greater than period "dTin" (step S1006, NO), the controller 20 registers suspend candidate point "SPS[s_index]" as suspend point "SP".

[Step S1010]

The controller 20 substitutes "s_index−1" for "e_index".

[Step S1011]

The controller 20 increments "e_index". Then, the controller 20 executes the operation of step S1002.

Here, the case was described in which the suspend point table is generated, for example, at the time of the test step prior to shipment of the storage device 1. However, the restriction to this case is unnecessary. For example, the user can generate the suspend point table, where necessary, after the shipment of the storage device 1. Besides, at a time of designing the memory system, the suspend point table may be generated and embedded in the firmware of the controller 20 (e.g. NAND controller 24).

In the meantime the suspend point table is generated by using the controller 20. However, the restriction to this is unnecessary. For example, the sequencer 120, host device 3, or an external device other than the host device 3, may generate the suspend point table described in the second embodiment.

Incidentally, the various processes of the present embodiment can be realized by a computer program. Thus, via a computer-readable storage medium which stores this computer program, the computer program may be installed in an ordinary computer and may be executed.

<5-4> Modification of the Fifth Embodiment

As described in the third embodiment, there is a case in which the "Auto Suspend Erase" operation is immediately suspended in response to the suspend command. In addition, there is a case in which in the chip 100, for example, only one suspend point table is prepared. In such cases, when the chip 100 resumes the "Auto Suspend Erase" operation, the chip 100 cannot determine a proper suspend point.

Thus, in the present modification, a description is given of a resume suspend point table in which such a suspend point that the chip 100 returns to the "ready" state within period "dTin" is registered for every suspend candidate point.

<5-5> Resume Suspend Point Table

Referring to FIG. 30, an example of the resume suspend point table is described. This resume suspend point table is registered, for example, in the NAND controller 24. A resume suspend point table illustrated in FIG. 30 indicates a relationship between the OEC, OPC and EVFY of a status read point SR, the OEC, OPC and EVFY of a resume point SPR, and the OEC, OPC and EVFY of a suspend point SP. The status read point SR is an index for selecting the resume point SPR, based on the OEC, OPC and EVFY which are obtained by executing status read. The resume point SPR specifies a timing of starting or resuming the "Erase" operation. Specifically, the chip 100 starts or resumes the "Erase" operation by using the OEC, OPC and EVFY which correspond to a resume point SPRv (v is an integer). In addition, the chip 100 suspends the "Auto Suspend Erase" operation at a suspend point SPy which corresponds to the resume point SPRy.

For example, as described in the third embodiment, there is a case in which the "Auto Suspend Erase" operation is suspended by the "FFh" command. The state (OEC, OPC and EVFY) of the "Auto Suspend Erase" operation at this time point is stored in the register 104. The controller 20 issues a status read command to the chip 100, when the controller 20 resumes the "Auto Suspend Erase" operation. Upon receiving the status read command, the chip 100 outputs the OEC, OPC and EVFY, which are stored in the register 104, to the controller 20. In addition, on the basis of the read-out OEC, OPC and EVFY, the controller 20 finds a status read point SRv from the resume suspend point table. Further, based on the status read point SRv, the controller 20 finds a resume point SPRv. Then, the controller 20 controls the chip 100 so as to suspend the "Auto Suspend Erase" operation with the OEC, OPC and EVFY of the suspend point SPv corresponding to the resume point SPRv.

In this manner, by preparing the resume suspend point table, even if the "Auto Suspend Erase" operation is suspended by the "FFh" command, as described in the third embodiment, the "Auto Suspend Erase" operation can properly be resumed.

<5-6> Resume Suspend Point Table Generation Flow

Figure 31:
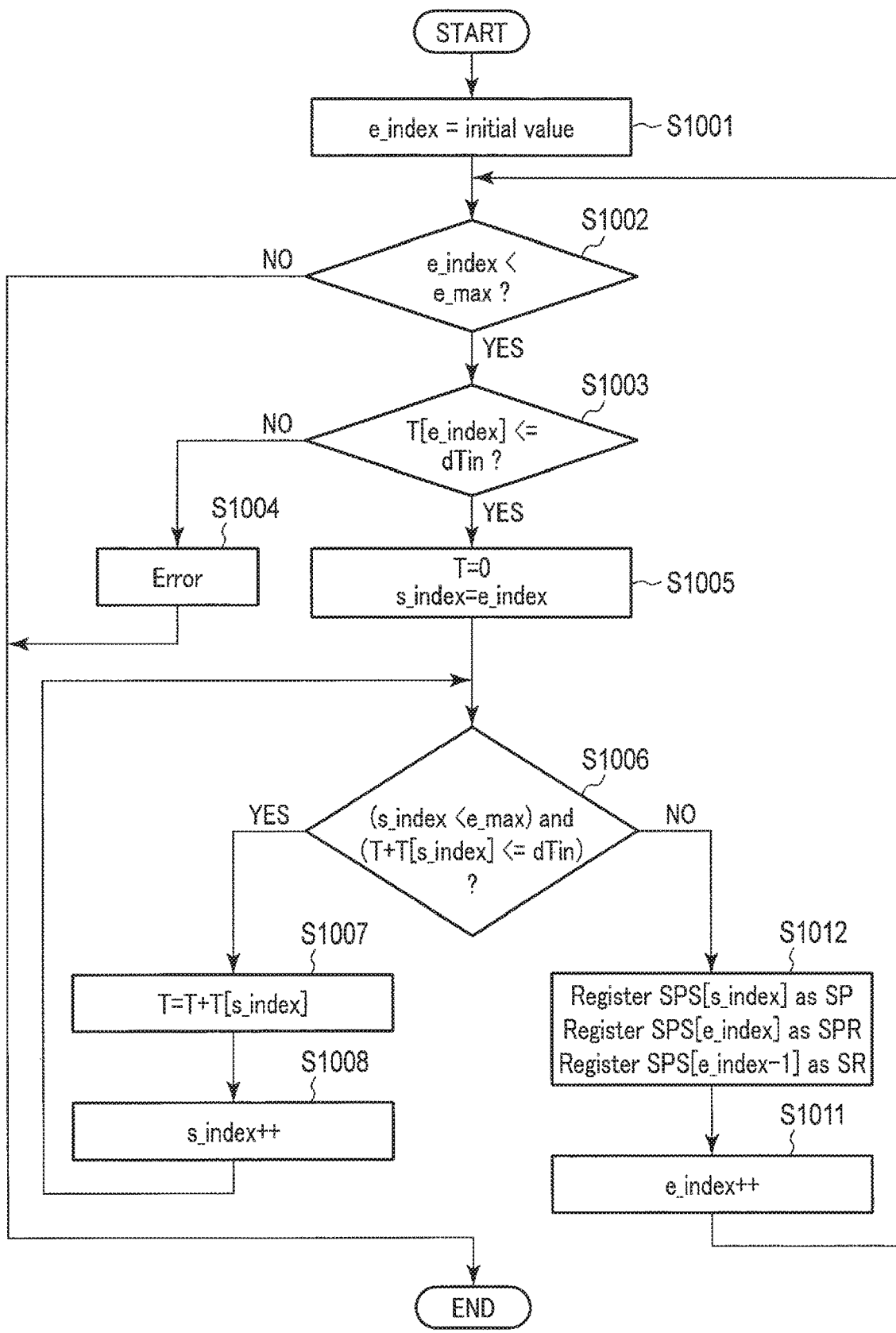
FIG. 31 is a flowchart for generating a suspend point table.

Referring to FIG. 31, a basic generation method of the resume suspend point table is described.

In the flow illustrated in FIG. 31, step S1010, which was described in FIG. 29, is omitted. In addition, in the flow of FIG. 31, the suspend candidate point table described in FIG. 28 is used.

[Step S1001] to [Step S1008], and [Step S1011]

The same operations as described in steps S1001 to step S1008 and step S1011, which were described with reference to FIG. 29, are executed.

[Step S1012]

If the controller 20 determines that "s_index" is not less than "e_max", or that time "T+T[s_index]" is greater than period "dTin" (step S1006, NO), the controller 20 registers suspend candidate point "SPS[e_index−1]" as status read point "SR", registers suspend candidate point "SPS[s_index]" as suspend point "SP", and registers suspend candidate point "SPS[e_index]" as resume point "SPR". The status read point "SR", suspend point "SP" and resume point "SPR" are associated and registered.

As described above, according to the present modification, the resume suspend point table can be generated.

In the meantime, in the flow illustrated in FIG. 31, the resume suspend point table can be generated by using a suspend candidate point table illustrated in FIG. 32. In the suspend candidate point table illustrated in FIG. 32, a relationship between the OEC, OPC and EVFY of the suspend candidate point SPS and the OEC, OPC and EVFY of the status read option point SRS is registered.

A description is given of a case of using the suspend candidate point table illustrated in FIG. 32 in the flow illustrated in FIG. 31.

In step S1012, the controller 20 registers suspend candidate point "SRS[e_index]" as status read point "SR", registers suspend candidate point "SPS[s_index]" as suspend point "SP", and registers suspend candidate point "SPS[e_index]" as resume point "SPR". The status read point "SR", suspend point "SP" and resume point "SPR" are associated and registered. As described above, the resume suspend point table can be generated.

<5-7> Modification 2 of the Fifth Embodiment

In addition, even while the data erase operation is being executed for the chip 100, the suspend point can be found.

At this time, the controller 20 finds the suspend point corresponding to the current OEC, OPC and EVFY.

In this case, the controller 20 needs to recognize the state of the data erase operation which is being executed in the chip 100. Thus, prior to step S1001 illustrated in FIG. 29, the controller 20 executes a status read operation for the chip 100. Thereby, the controller 20 reads out the OEC, OPC and EVFY stored in the register 104. In addition, based on the read-out OEC, OPC and EVFY, the controller 20 selects "SRS" from the suspend candidate point table illustrated in FIG. 32. Further, the controller 20 sets the "e_index" corresponding to the selected "SRS" as the initial value. Then, the controller 20 executes the operation illustrated in FIG. 29. As described above, even while the data erase operation is being executed for the chip 100, the suspend point can be found. During the data erase operation, the controller 20 does not need to generate the suspend point table. Thus, when the controller 20 executes the operation of FIG. 29, the controller 20 may terminate the operation of FIG. 29, without executing step S1009 to step S1011. Specifically, at a time point when "NO" is determined in step S1006 of FIG. 29, the controller 20 stores the OEC, OPC and EVFY based on SPS[s_indes] as the suspend point SP in the register 104. Then, if the suspend point SP is stored in the register 104, the controller 20 terminates the operation of FIG. 29.

When the sequencer 120 resumes the data erase operation, the sequencer 120 reads out the information (OEC, OPC and EVFY) relating to the suspend point SP, which is stored in the register 104. The sequencer 120 suspends the data erase operation, based on the acquired information relating to the suspend point SP.

In addition, even when the controller 20 determines in step S1004 that period "T[e_index]" is greater than period "dTin", the controller 20 may transition to step S1005.

As described above, even while the controller 20 is executing the data erase operation, the controller 20 can find the suspend point.

In each embodiment of the present invention, (1) in the read operation, the voltage applied to a word line selected in the read operation of A level is, for example, 0 V to 0.55 V. However, the voltage is not limited to this and may be 0.1 V to 0.24 V, 0.21 V to 0.31 V, 0.31 V to 0.4 V, 0.4 V to 0.5 V, or 0.5 V to 0.55 V.

The voltage applied to a word line selected in the read operation of B level is, for example, 1.5 V to 2.3 V. However, the voltage is not limited to this and may be 1.65 V to 1.8 V, 1.8 V to 1.95 V, 1.95 V to 2.1 V, or 2.1 V to 2.3 V.

The voltage applied to a word line selected in the read operation of C level is, for example, 3.0 V to 4.0 V. However, the voltage is not limited to this and may be 3.0 V to 3.2 V, 3.2 V to 3.4 V, 3.4 V to 3.5 V, 3.5 V to 3.6 V, or 3.6 V to 4.0 V.

The time (tR) of the read operation can be, for example, 25 μs to 38 μs, 38 μs to 70 μs, or 70 μs to 80 μs.

(2) The write operation includes a program operation and a verify operation, as described above. In the write operation, the voltage first applied to a word line selected at the time of program operation is, for example, 13.7 V to 14.3 V. However, the voltage is not limited to this and may be, for example, 13.7 V to 14.0 V or 14.0 V to 14.6 V.

The voltage first applied to a selected word line when writing to an odd-numbered word line and the voltage first applied to a selected word line when writing to an even-numbered word line may be different.

When the program operation is performed by the ISPP method (Incremental Step Pulse Program), the step-up voltage is, for example, 0.5 V.

The voltage applied to a non-selected word line can be, for example, 6.0 V to 7.3 V. However, the voltage is not limited to this and may be, for example, 7.3 V to 8.4 V, or 6.0 V or less.

The pass voltage to be applied may be changed depending on whether the non-selected word line is an odd-numbered word line or an even-numbered word line.

The time (tProg) of the write operation can be, for example, 1700 μs to 1800 μs, 1800 μs to 1900 μs, or 1900 μs to 2000 μs.

(3) In the erase operation, the voltage first applied to a well formed in the upper portion of a semiconductor substrate and having a memory cell arranged above is, for example, 12 V to 13.6 V. However, the voltage is not limited to this and may be, for example, 13.6 V to 14.8 V, 14.8 V to 19.0 V, 19.0 V to 19.8 V, 19.8 V to 21 V.

The time (tErase) of the erase operation can be, for example, 3000 μs to 4000 μs, 4000 μs to 5000 μs, or 4000 μs to 9000 μs.

(4) A memory cell includes a charge accumulation layer arranged on a 4 to 10 nm thick tunnel insulating film on a semiconductor substrate (silicon substrate). The charge accumulation layer can have a stacked structure including a 2 to 3 nm thick insulating film made of SiN, SiON, or the like and a 3 to 8 nm thick polysilicon film. A metal such as Ru may be added to polysilicon. An insulating film is formed on the charge accumulation layer. This insulating film includes, for example, a 4 to 10 nm thick silicon oxide film sandwiched between a 3 to 10 nm thick lower high-k film and a 3 to 10 nm thick upper high-k film. The high-k films are made of, for example, HfO. The silicon oxide film can be thicker than the high-k films. A 30 to 70 nm thick control electrode is formed on a 3 to 10 nm thick material on the insulating film. A material used to adjust the work function is a metal oxide film such as TaO or a metal nitride film such as TaN. W or the like can be used for the control electrode.

An air gap can be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A storage device comprising:
   a first memory cell;
   a second memory cell; and
   a controller configured to:
   in response to receiving a first command set when the first memory cell is in a ready state, execute an erase operation on the first memory cell, the erase operation including a plurality of voltage application steps, and the first command set including an erase command and a first address of the first memory cell; and
   in response to receiving a second command set when the first memory cell is in the ready state, execute a divided erase operation on the first memory cell, the divided erase operation including a part, but not all, of the voltage application steps, said part being at least a part of one of the voltage application steps, and the second command set including a first command, the erase command, and the first address,
wherein the first command set does not include the first command, and
wherein an erase voltage level that is applied in a first step of the plurality of voltage application steps in the erase operation is the same as an erase voltage level that is applied in a first or only step of said at least the part of the voltage application steps in the divided erase operation.

2. The storage device of claim 1, wherein the first command is a command other than a read command, a write command, and the erase command.

3. The storage device of claim 1, wherein the controller is configured to, in response to receiving a third command set after the second command set, execute a read or write operation on the second memory cell and subsequently execute another divided erase operation on the first memory cell, the another divided erase operation including another part of the voltage application steps, and the third command set including a second command, a read or write command, and a second address of the second memory cell.

4. The storage device of claim 3, wherein the controller is configured to:
in response to receiving a fourth command set after the second command set, execute the read or write operation on the second memory cell, the fourth command set including the read or write command and the second address; and
in response to receiving a fifth command set after the fourth command set, execute the another divided erase operation on the first memory cell, the fifth command set including a third command, the erase command, and the first address.

5. The storage device of claim 1, further comprising a register configured to store suspend information when the erase operation or the divided erase operation is suspended during a given one of the voltage application steps, the suspend information including a time period between a timing when the given one of the voltage application steps is started and a timing when the erase operation or the divided erase operation is suspended,
wherein the controller is configured to resume the erase operation or the divided erase operation based on the suspend information.

6. The storage device of claim 1, further comprising a storage unit configured to store a table in which first information is registered, the first information correlating at least one of end timings of the voltage application steps to an end timing of the divided erase operation.

7. A controlling method of a storage device, the method comprising:
receiving a first command set when a first memory cell is in a ready state, and executing, in response to the first comment set, an erase operation on the first memory cell, the erase operation including a plurality of voltage application steps, and the first command set including an erase command and a first address of the first memory cell; and
receiving a second command set when the first memory cell is in the ready state at a different time from when the first command set is received, and executing, in response to the second command set, a divided erase operation on the first memory cell, the divided erase operation including a part, but not all, of the voltage application steps, said part being at least a part of one of the voltage application steps, and the second command set including a first command, the erase command, and the first address,
wherein the first command set does not include the first command, and
wherein an erase voltage level that is applied in a first step of the plurality of voltage application steps in the erase operation is the same as an erase voltage level that is applied in a first or only step of said at least the part of the voltage application steps in the divided erase operation.

8. The method of claim 7, wherein the first command is a command other than a read command, a write command, and the erase command.

9. The method of claim 7, further comprising receiving a third command set after the second command set, and executing, in response to the third command set, a read or write operation on a second memory cell and subsequently executing another divided erase operation on the first memory cell, the another divided erase operation including another part of the voltage application steps, and the third command set including a second command, a read or write command, and a second address of the second memory cell.

10. The method of claim 7, further comprising:
receiving a fourth command set after the second command set, and, in response to the fourth command set, executing a read or write operation on the second memory cell, the fourth command set including a read or write command and a second address of the second memory cell; and
receiving a fifth command set after the fourth command set, and executing, in response to the fifth command set, another divided erase operation on the first memory cell, the another divided erase operation including another part of the voltage application steps, and the fifth command set including a third command, the erase command, and the first address.

11. The method of claim 7, further comprising storing suspend information when the erase operation or the divided erase operation is suspended during a given one of the voltage application steps, the suspend information including a time period between a timing when the given one of the voltage application steps is started and a timing when the erase operation or the divided erase operation is suspended, and resuming the erase operation or the divided erase operation based on the suspend information.

12. The method of claim 7, further comprising storing a table in which first information is registered, the first information correlating at least one of end timings of the voltage application steps to an end timing of the divided erase operation.

13. The storage device of claim 1, wherein the controller is configured to:
in response to receiving a fifth command set when the first memory cell is in a busy state after the second command set is received, suspend the divided erase operation after elapse of a first period from when the fifth command set is received, and execute a read or write operation on the second memory cell, the fifth command set including a fourth command, a read or write command, and a second address of the second memory cell; and
in response to receiving a sixth command set when the first memory cell is in a busy state after the second command set is received, suspend the divided erase operation after elapse of a second period from when the sixth command set is received, and execute the read or write operation on the second memory cell, the sixth command set including a fifth command, the read or write command, and the second address, wherein the first period is shorter than the second period.

14. The storage device of claim 13, wherein the controller is configured to:
in response to receiving a seventh command set after the fifth command set, resume the divided erase operation with application of a first erase voltage, the seventh command set including a sixth command, the erase command, and the first address; and
in response to receiving the seventh command set after the sixth command set, start another divided erase operation with application of a second erase voltage, the another divided erase operation including another part of the voltage application steps, and the second erase voltage being higher than the first erase voltage.

15. The storage device of claim 1, wherein the controller is configured to:
in response to receiving an eighth command set after the second command set, execute another divided erase operation on the first memory cell, the another divided erase operation including another part of the voltage application steps, and the eighth command set including a seventh command, the erase command, and the first address; and
in response to receiving the eighth command set again, execute still another divided erase operation on the first memory cell, the still another divided erase operation including still another part of the voltage application steps.

16. The method of claim 7, further comprising:
receiving a fifth command set when the first memory cell is in a busy state after the second command set is received, and suspending, in response to the fifth command set, the divided erase operation after elapse of a first period from when the fifth command set is received, and executing a read or write operation on the second memory cell, the fifth command set including a fourth command, a read or write command, and a second address of the second memory cell; and
receiving a sixth command set when the first memory cell is in a busy state after the first command set is received, and suspending, in response to the sixth command set, the divided erase operation after elapse of a second period from when the sixth command set is received, and executing the read or write operation on the second memory cell, the sixth command set including a fifth command, the read or write command, and the second address, wherein the first period is shorter than the second period.

17. The method of claim 16, further comprising:
receiving a seventh command set after the fifth command set, and resuming, in response to the seventh command set, the divided erase operation with application of a first erase voltage, the seventh command set including a sixth command, the erase command, and the first address; and
receiving the seventh command set after the sixth command set at a different time from when the first command set is received, and starting, in response to the seventh command set, another divided erase operation with application of a second erase voltage, the another divided erase operation including another part of the voltage application steps, and the second erase voltage being higher than the first erase voltage.

18. The method of claim 7, further comprising:
receiving an eighth command set after the second command set, and executing, in response to the eighth command set, another divided erase operation on the first memory cell, the another divided erase operation including another part of the voltage application steps, and the eighth command set including a seventh command, the erase command, and the first address; and
receiving the eighth command set again, and executing, in response to the eighth command set, still another divided erase operation on the first memory cell, the still another divided erase operation including still another part of the voltage application steps.

19. The storage device of claim 5, wherein:
the voltage application steps include a first application with a first level of an erase voltage and a second application with a second level of the erase voltage, the first application being followed by the second application, and the second level being higher than the first level,
the timing when the erase operation or the divided erase operation is suspended is in a timing during the first application, and
the suspend information includes a time period between a timing when the first application is started and the timing when the erase operation or the divided erase operation is suspended.

20. The storage device of claim 5, wherein the erase operation further includes a plurality of verify operations, and
wherein each of the voltage application steps includes at least one voltage apply operation and is followed by one of the plurality of verify operations.

21. The storage device according to claim 5, wherein the controller is configured to suspend the erase operation at an intermediate point of the given one of the voltage application steps in response to receiving a suspend command, and the controller is configured to resume the erase operation based on the suspend information such that the controller resumes the erase operation based on the timing when the erase operation or the divided erase operation was suspended.

22. The storage device of claim 1, wherein the ready state is a state before stored data is erased.

* * * * *